(12) United States Patent
Ogihara et al.

(10) Patent No.: US 8,951,917 B2
(45) Date of Patent: Feb. 10, 2015

(54) COMPOSITION FOR FORMING RESIST UNDERLAYER FILM AND PATTERNING PROCESS USING THE SAME

(75) Inventors: Tsutomu Ogihara, Jyoetsu (JP); Takafumi Ueda, Jyoetsu (JP); Toshiharu Yano, Jyoetsu (JP); Fujio Yagihashi, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 175 days.

(21) Appl. No.: 13/524,669

(22) Filed: Jun. 15, 2012

(65) Prior Publication Data

US 2013/0005150 A1   Jan. 3, 2013

(30) Foreign Application Priority Data

Jun. 28, 2011   (JP) ................................. 2011-142657
Oct. 5, 2011   (JP) ................................. 2011-220708

(51) Int. Cl.
*C09D 183/00* (2006.01)
*C09D 183/06* (2006.01)
(Continued)

(52) U.S. Cl.
CPC ............... *C09D 183/06* (2013.01); *C08L 83/06* (2013.01); *G03F 7/0751* (2013.01);
(Continued)

(58) Field of Classification Search
CPC ..... C09D 183/00; C09D 183/06; C08L 83/06
See application file for complete search history.

(56) References Cited

U.S. PATENT DOCUMENTS 4,510,136 A   4/1985 Moberg
5,508,358 A   4/1996 Ono et al.
(Continued)

FOREIGN PATENT DOCUMENTS

EP   1 628 160 A2   2/2006
EP   2 103 655 A1   9/2009
(Continued)

OTHER PUBLICATIONS

Oct. 9, 2012 Extended European Search Report issued in European Patent Application No. 12004626.3.
(Continued)

*Primary Examiner* — Robert S Loewe
(74) *Attorney, Agent, or Firm* — Oliff PLC

(57) ABSTRACT

The invention provides a composition for forming a silicon-containing resist underlayer film comprising: (A) a silicon-containing compound obtained by a hydrolysis-condensation reaction of a mixture containing, at least, one or more hydrolysable silicon compound shown by the following general formula (1) and one or more hydrolysable compound shown by the following general formula (2), and (B) a silicon-containing compound obtained by a hydrolysis-condensation reaction of a mixture containing, at least, one or more hydrolysable silicon compound shown by the following general formula (3) and one or more hydrolysable silicon compound shown by the following general formula (4). There can be provided a composition for forming a resist underlayer film applicable not only to a resist pattern obtained in a negative development but also to a resist pattern obtained in a conventional positive development, and a patterning process using this composition $$R^1{}_{m1}R^2{}_{m2}R^3{}_{m3}\text{Si}(\text{OR})_{(4-m1-m2-m3)} \quad (1)$$

$$U(\text{OR}^4)_{m4}(\text{OR}^5)_{m5} \quad (2)$$

$$R^6{}_{m6}R^7{}_{m7}R^8{}_{m8}\text{Si}(\text{OR}^9)_{(4-m6-m7-m8)} \quad (3)$$

$$\text{Si}(\text{OR}^{10})_4 \quad (4).$$

24 Claims, 1 Drawing Sheet

(51) Int. Cl.
*C08L 83/06* (2006.01)
*H01L 21/312* (2006.01)
*G03F 7/075* (2006.01)
*G03F 7/09* (2006.01)
*C08G 77/14* (2006.01)
*C08G 77/18* (2006.01)
*C08G 77/56* (2006.01)
*C08G 77/58* (2006.01)

(52) U.S. Cl.
CPC .............. *G03F 7/0752* (2013.01); *G03F 7/094* (2013.01); *C08G 77/14* (2013.01); *C08G 77/18* (2013.01); *C08G 77/56* (2013.01); *C08G 77/58* (2013.01)
USPC ........... 438/694; 524/540; 524/539; 524/500; 257/E21.259

(56) References Cited

U.S. PATENT DOCUMENTS

| | | | |
|---|---|---|---|
| 5,632,910 | A | 5/1997 | Nagayama et al. |
| 7,651,829 | B2 | 1/2010 | Hamada et al. |
| 2001/0016635 | A1 | 8/2001 | Evain et al. |
| 2002/0187422 | A1 | 12/2002 | Angelopoulos et al. |
| 2003/0191268 | A1 | 10/2003 | Iwasawa et al. |
| 2003/0235786 | A1 | 12/2003 | Krishnamurthy et al. |
| 2004/0058275 | A1 | 3/2004 | Neef et al. |
| 2004/0241579 | A1 | 12/2004 | Hamada et al. |
| 2005/0048395 | A1 | 3/2005 | Kobayashi et al. |
| 2005/0112383 | A1 | 5/2005 | Tanaka et al. |
| 2006/0019195 | A1 | 1/2006 | Hatakeyama et al. |
| 2006/0040206 | A1 | 2/2006 | Nakashima et al. |
| 2007/0134916 | A1* | 6/2007 | Iwabuchi et al. ............ 438/636 |
| 2007/0203275 | A1 | 8/2007 | Kikuchi et al. |
| 2007/0231738 | A1 | 10/2007 | Kaneko et al. |
| 2007/0238300 | A1 | 10/2007 | Ogihara et al. |
| 2008/0026322 | A1* | 1/2008 | Ogihara et al. ............ 430/270.1 |
| 2009/0011366 | A1 | 1/2009 | Tsubaki et al. |
| 2009/0136869 | A1 | 5/2009 | Ogihara et al. |
| 2010/0040972 | A1 | 2/2010 | Tarutani et al. |
| 2010/0041805 | A1 | 2/2010 | Amidaiji et al. |
| 2010/0086872 | A1 | 4/2010 | Ogihara et al. |
| 2012/0276483 | A1 | 11/2012 | Ogihara et al. |

FOREIGN PATENT DOCUMENTS

| | | |
|---|---|---|
| EP | 1 798 599 A1 | 4/2010 |
| EP | 2 172 808 A1 | 4/2010 |
| EP | 2 518 562 A2 | 10/2012 |
| EP | 2 540 780 A1 | 1/2013 |
| JP | A-7-181688 | 7/1995 |
| JP | A-7-183194 | 7/1995 |
| JP | A-11-258813 | 9/1999 |
| JP | A-2000-053921 | 2/2000 |
| JP | A-2004-153125 | 5/2004 |
| JP | A-2005-128509 | 5/2005 |
| JP | A-2005-173552 | 6/2005 |
| JP | A-2005-520354 | 7/2005 |
| JP | A-2005-537502 | 12/2005 |
| JP | A-2006-508377 | 3/2006 |
| JP | A-2006-251369 | 9/2006 |
| JP | A-2006-317864 | 11/2006 |
| JP | A-2007-199653 | 8/2007 |
| JP | A-2007-297590 | 11/2007 |
| JP | A-2007-302873 | 11/2007 |
| JP | A-2008-281974 | 11/2008 |
| JP | A-2008-281980 | 11/2008 |
| JP | A-2009-53657 | 3/2009 |
| JP | A-2009-126940 | 6/2009 |
| JP | A-2010-85893 | 4/2010 |
| JP | B2-4716037 | 7/2011 |
| WO | WO 2004/007192 A1 | 1/2004 |
| WO | WO 2011/105368 A1 | 9/2011 |

OTHER PUBLICATIONS

Aug. 19, 2014 Notification of Reasons for Refusal issued in Japanese Patent Application No. 2011-220708 (with partial translation).
Jul. 23, 2014 Office Action issued in European Patent Application No. 12 004 626.3.
Database Reaxys [Online], Sumitomo Chemical Company, Limited, "Organic Silicon-Based Compound and Method of Producing the Same," Aug. 30, 2007, XP002698567.
Temtsin et al., "Aromatic PMOs: tolyl, xylyl and dimethoxyphenyl groups integrated within the channel walls of hexagonal mesoporous silicas," *Journal of Materials Chemistry*, vol. 11, No. 12, Oct. 23, 2001, pp. 3202-3206.
Database Reaxys [Online], Manoso et al., "Improved Synthesis of Aryltrialkoxysilanes via Treatment of Aryl Grignard or Lithium Reagents with Tetraalkyl Orthosilicates, " 2004, XP002698569.
Database Reaxys [Online], Seganish et al., "Efforts Directed toward the Synthesis of Colchicine: Application of Palladium-Catalyzed Siloxane Cross-Coupling Methodology," 2005, XP002698569.
Database CA [Online], Virtanen et al., "Organosilane and their hydrolytic polymers as surface treatment agents for use in chromatography and electronics," 1987, XP002698571.
Database CA [Online], Harkonen et al., "External silane donors in Ziegler-Natta catalysis. An approach to the optimum structure of the donor," 1992, XP002698572.
Database CA [Online], O'Dell, R., "A convenient synthesis of arylbis (ethyltrifluorosiliconate)s," 1995, XP002698573.
Jun. 24, 2013 Extended Search Report issued in European Application No. 13002020.9.
Oct. 9, 2014 Office Action issued in European Patent Application No. 13002020.9-1451.
Jun. 19, 2013 Extended European Search Report issued in European Patent Application No. EP. 13 00 0600.0.
May 20, 2014 Office Action issued in Japanese Patent Application No. 2012-029230 (with partial translation).
U.S. Appl. No. 14/107,841 in the name of Ogihara et al., filed Dec. 16, 2013.
Maenhoudt et al., "Double Patterning scheme for sub-0.25 k1 single damascene structures at NA=0.75, λ=193nm", *Proceedings of SPIE*, 2005, vol. 5754, pp. 1508-1518.
Nakamura et al., "Contact Hole Formation by Multiple Exposure Technique in Ultra-low k1 Lithography", *Proceedings of SPIE*, 2004, vol. 5377, pp. 255-263.
Jun. 13, 2013 European Search Report issued in European Patent Application No. EP 13000599.4.
Oct. 21, 2014 Office Action issued in U.S. Appl. No. 13/854,622.
Feb. 10, 2014 Office Action issued in U.S. Appl. No. 13/430,319.
Jul. 17, 2013 Office Action issued in U.S. Appl. No. 13/430,319.
Sep. 4, 2014 Office Action issued in U.S. Appl. No. 13/747,125.
Aug. 29, 2014 Office Action issued in U.S. Appl. No. 13/747,154.
U.S Appl. No. 14/107,500 in the name of Ogihara et al., filed Dec. 16, 2013.
U.S. Appl. No. 13/747,125 in the name of Ogihara et al., filed Jan. 22, 2013.
U.S. Appl. No. 13/747,154 in the name of Ogihara et al., filed Jan. 22, 2013.
U.S. Appl. No. 13/854,622 in the name of Ogihara et al., filed Apr. 1, 2013.

\* cited by examiner

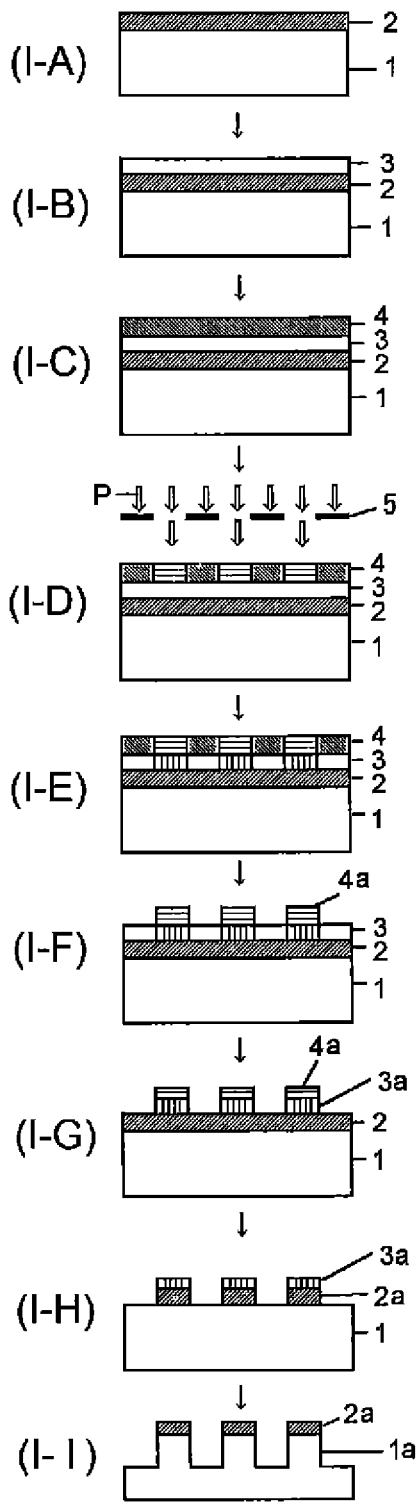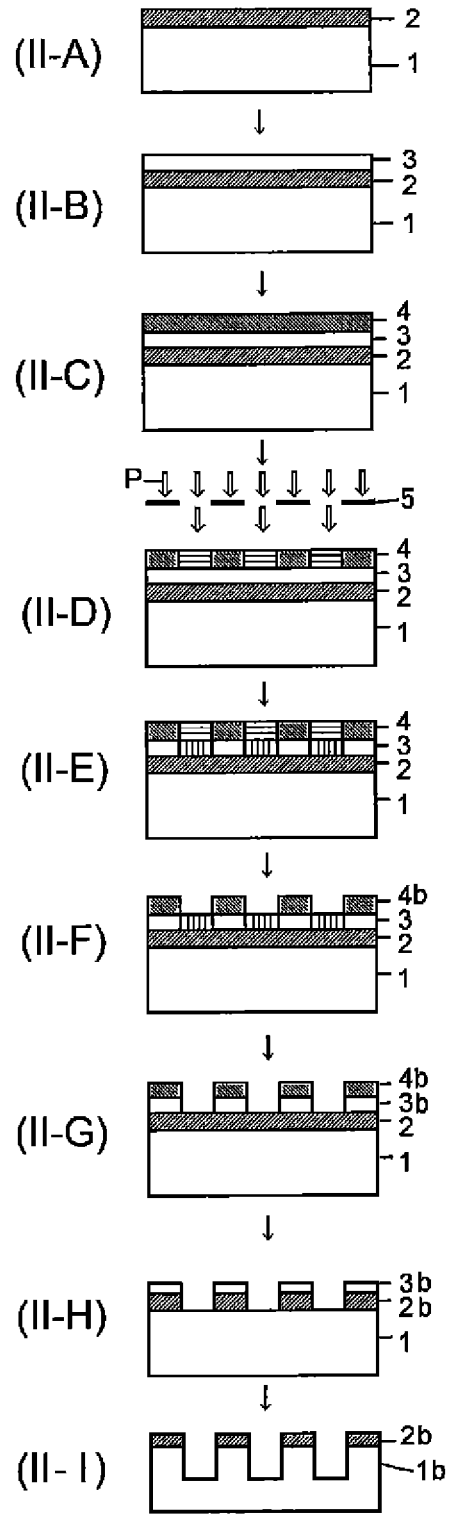

COMPOSITION FOR FORMING RESIST UNDERLAYER FILM AND PATTERNING PROCESS USING THE SAME

BACKGROUND OF THE INVENTION

1. Field of the Invention

The present invention relates to a composition for forming a silicon-containing resist underlayer film and a patterning process using the same.

2. Description of the Related Art

In 1980s, a g-line (436 nm) or an i-line (365 nm) of a mercury lamp was used as an exposure light to be used in a resist pattern forming. As a mean for further miniaturization, a method of shifting to a shorter wavelength of an exposing light was assumed to be effective. As a result, in a mass production process after DRAM (Dynamic Random Access Memory) with 64-megabits (0.25 µm or less of a processing dimension) in 1990s, a KrF excimer laser (248 nm), a shorter wavelength than an i-line (365 nm), was used in place of an i-line as an exposure light source. However, in production of DRAM with an integration of 256 M, 1 G and higher which require further miniaturized process technologies (process dimension of 0.2 µm or less), a light source with a further short wavelength is required, and thus a photo lithography using an ArF excimer laser (193 nm) has been investigated seriously since about a decade ago. At first, an ArF lithography was planned to be applied to a device starting from a 180 nm node device, but a KrF excimer laser lithography lived long to a mass production of a 130 nm node device, and thus a full-fledged application of an ArF lithography will start from a 90 nm node. Further, a study of a 65 nm node device by combining with a lens having an increased NA till 0.9 is now underway.

Further shortening of wavelength of an exposure light is progressing towards the next 45 nm node device, and for that an $F_2$ lithography with a 157 nm wavelength became a candidate. However, there are many problems in an $F_2$ lithography; an increase in cost of a scanner due to the use of a large quantity of expensive $CaF_2$ single crystals for a projector lens, extremely poor sustainability of a soft pellicle, which leads to a change of an optical system due to introduction of a hard pellicle, a decrease in an etching resistance of a resist film, and the like. Because of these problems, it has been abandon the development of an $F_2$ lithography and introduced an ArF immersion lithography earlier.

In the ArF liquid immersion lithography, water having a refractive index of 1.44 is inserted between the projection lens and a wafer by a partial filling manner to enable high-speed scanning, thereby allowing to conduct mass-production of 45 nm node devices by a lens having an NA on the order of 1.3.

Exemplary candidates of lithography techniques for 32 nm nodes include extreme ultraviolet (EUV) lithography at a wavelength of 13.5 nm. Then, exemplary objects accompanying to the EUV lithography are to increase an output of laser, enhance a sensitivity of resist film, enhance a resolution, decrease a line edge roughness (LER), achieve a defect-free MoSi laminate mask, lower aberrations of a reflecting mirror, for example, thereby leaving a pile of objects to be attained.

Another candidate of 32 nm nodes is a high refractive index liquid immersion lithography, the development of which has been abandoned, due to lower transmittance of LuAG as a candidate of high refractive index lens therefor, and due to failure of achievement of a refractive index of a liquid to be increased up to a targeted value of 1.8.

As mentioned above, a photo-exposure method used as a general-purpose technology is reaching an inherent limit of its resolution due to wavelength of a light source. Accordingly, in recent years, an organic solvent development, with which a very fine hole pattern that cannot be accomplished by a conventional patterning process with a positive tone using an alkaline developer is obtained by a patterning process with a negative tone using an organic solvent developer, has been receiving an attention again. This is a process to form a negative pattern by an organic solvent developer by using a high resolution positive resist composition. In addition, investigation is being carried out to obtain twofold resolution by combining two developments of an alkaline development and an organic solvent development.

Usable as an ArF resist composition for development in a negative tone by an organic solvent like this, is a positive ArF resist composition of a conventional type, and examples of patterning processes therefor are shown in Japanese Patent Laid-Open (kokai) No. 2008-281974, Japanese Patent Laid-Open (kokai) No. 2008-281980, Japanese Patent Laid-Open (kokai) No. 2009-53657, for example.

As one method to transfer the thus formed negative-tone pattern to a substrate, multi-layer resist process have been used. The methods are configured to: interpose an intermediate film, for example a resist underlayer film containing silicon atom, having an etching selectivity different from that of a photoresist film, i.e., a resist upper layer film, between the resist upper layer film and a body to be processed; obtain a pattern in the resist upper layer film; thereafter transfer the pattern to the resist underlayer film by dry etching by using the obtained resist upper layer film pattern as a dry etching mask; and further transfer the pattern onto the body to be processed by dry etching by using the obtained pattern of the resist underlayer film as a dry etching mask.

Examples of silicon-containing resist underlayer films to be used in the above-described multi-layer resist process include silicon-containing inorganic films by CVD, such as $SiO_2$ films (Japanese Patent Laid-Open (kokai) No. H7-183194, for example) and SiON films (Japanese Patent Laid-Open (kokai) No. H7-181688, for example); and films obtained by spin coating, such as SOG (spin-on-glass) films (Japanese Patent Laid-Open (kokai) No. 2007-302873, for example), and crosslinkable silsesquioxane films (Japanese translation of PCT international application No. 2005-520354, for example).

SUMMARY OF THE INVENTION

Contrary to a positive development (alkaline development) in which a resist pattern formed of a hydrophobic compound not soluble in an alkaline developer is obtained, in a negative development (organic solvent development), a resist pattern formed of a hydrophilic organic compound containing, in high concentration, an acidic group such as a carboxyl group generated by a deprotection reaction is obtained; and thus, performance of a photo resist cannot be realized sufficiently with a conventional resist underlayer film for an alkaline development.

On the other hand, if a resist underlayer film used in a negative development is different from a resist underlayer film used in a positive development, piping equipment solely dedicated to respective developments are necessary; and thus, this is economically irrational.

The present invention was made in view of the problems as mentioned above, and has an object to provide (i) a composition for forming a silicon-containing resist underlayer film applicable not only to a resist pattern formed of a hydrophilic organic compound obtained in a negative development but also to a resist pattern formed of a hydrophobic compound obtained in a conventional positive development, and (ii) a patterning process using this composition.

Namely, the present invention provides a composition for forming a silicon-containing resist underlayer film comprising;

(A) a silicon-containing compound obtained by a hydrolysis-condensation reaction of a mixture containing, at least, one or more hydrolysable silicon compound shown by the following general formula (1) and one or more hydrolysable compound shown by the following general formula (2),

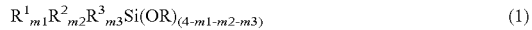
$$R^1_{m1}R^2_{m2}R^3_{m3}Si(OR)_{(4-m1-m2-m3)} \quad (1)$$

wherein, R represents a hydrocarbon group having 1 to 6 carbon atoms; at least one of $R^1$, $R^2$, and $R^3$ is an organic group containing a hydroxyl group or a carboxyl group, the groups being substituted with an acid-labile group, while the other is a hydrogen atom or a monovalent organic group having 1 to 30 carbon atoms; and m1, m2, and m3 represent 0 or 1 and satisfy $1 \leq m1+m2+m3 \leq 3$;

$$U(OR^4)_{m4}(OR^5)_{m5} \quad (2)$$

wherein, $R^4$ and $R^5$ represent an organic group having 1 to 30 carbon atoms, and m4+m5 is the same number as the number determined by valency of U; m4 and m5 represent an integer of 0 or more; and the U is an element belonging to groups of III, IV, or V in a periodic table except for carbon and silicon;

(B) a silicon-containing compound obtained by a hydrolysis-condensation reaction of a mixture containing, at least, one or more hydrolysable silicon compound shown by the following general formula (3) and one or more hydrolysable silicon compound shown by the following general formula (4),

$$R^6_{m6}R^7_{m7}R^8_{m8}Si(OR^9)_{(4-m6-m7-m8)} \quad (3)$$

wherein, $R^9$ represents an alkyl group having 1 to 6 carbon atoms, and each $R^6$, $R^7$, and $R^9$ represents a hydrogen atom or a monovalent organic group having 1 to 30 carbon atoms; and m6, m7, and m8 represent 0 or 1 and satisfy $1 \leq m6+m7+m3 \leq 8$; and

$$Si(OR^{10})_4 \quad (4)$$

wherein, $R^{10}$ represents an alkyl group having 1 to 6 carbon atoms.

In a positive development, it has been experimentally known that, if a contact angle of a resist pattern obtained after photo-exposure is made coincident with a contact angle of a resist underlayer film, it is effective to enhance adhesion and to lower roughness in a resist pattern. However, in a negative pattern obtained by a negative development, when comparison is made on film properties between the photoresist film before photo-exposure and the resist pattern after photo-exposure, amount of a hydrophilic group such as a carboxyl group and a phenolic hydroxyl group due to elimination of an acid-labile group caused by an acid generated by the photo-exposure is increased in the resist pattern after the photo-exposure; and as a result, a contact angle of the resist pattern is shifted toward a hydrophilic side, i.e., a lower side, as compared with that before the photo-exposure. Because of this, it was found, in a conventional underlayer film for positive resist whose contact angle is made coincident with that of a photoresist film before the photo-exposure, discrepancy from the contact angle of the negative pattern is generated thereby causing pattern fall and an adverse effect in roughness. In other words, if the contact angle in a part of the resist underlayer film corresponding to an exposed area of the photoresist film is approximated to the contact angle of the negative pattern of the photoresist and the contact angle in the part corresponding to an unexposed area thereof is approximated to the contact angle of the positive pattern of the photoresist, a resist underlayer film applicable to both the negative and positive development processes can be obtained. Accordingly, the composition for forming a silicon-containing resist underlayer film as mentioned above becomes a composition for forming a silicon-containing resist underlayer film giving a silicon-containing resist underlayer film that has an enhanced adhesion with a photoresist pattern and does not cause pattern fall even in a pattern with a narrow line in any of the processes.

In addition, it is preferable that mass ratio of the component (A) to the component (B) satisfies (B)/(A)≥1.

Further, of the constituting units derived from the general formula (3) and the general formula (4) in the component (B), it is preferable that mole ratio of the constituting unit derived from the general formula (4) is 50% or more by mole.

By using appropriate silicon-containing compounds in the component (A) and the component (B) used in the present invention and selecting appropriate mass ratio thereof as mentioned above, a composition being capable of forming a resist underlayer film not only having excellent storage stability and adhesion but also not changing patterning properties in both the negative and positive developments can be obtained.

In addition, it is preferable that the U of the general formula (2) is any of boron, aluminum, gallium, yttrium, germanium, titanium, zirconium, hafnium, bismuth, tin, phosphorous, vanadium, arsenic, antimony, niobium, and tantalum.

As mentioned above, by introducing the foregoing elements, optimization of etching selectivity between the photoresist and the resist underlayer film becomes possible so that a composition formable the resist underlayer film having excellent size stability during dry etching may be obtained.

In addition, the present invention provides a patterning process, wherein an organic underlayer film is formed on a body to be processed by using an application-type composition for the organic underlayer film, on this organic underlayer film is formed a silicon-containing resist underlayer film by using the composition for forming the silicon-containing resist underlayer film, on this silicon-containing resist underlayer film is formed a photoresist film by using a chemically amplified resist composition, the photoresist film is exposed to a high energy beam after heat treatment, a positive pattern is formed by dissolving an exposed area of the photoresist film by using an alkaline developer, pattern transfer is made onto the silicon-containing resist underlayer film by dry-etching by using the photoresist film having the positive pattern as a mask, pattern transfer is made onto the organic underlayer film by dry-etching by using the silicon-containing resist underlayer film having the transferred pattern as a mask, and then pattern transfer is made onto the body to be processed by dry-etching by using the organic underlayer film having the transferred pattern as a mask.

Further, the present invention provides a patterning process, wherein an organic hard mask mainly comprising carbon is formed on a body to be processed by a CVD method, on this organic hard mask is formed a silicon-containing resist underlayer film by using the composition for forming the silicon-containing resist underlayer film, on this silicon-containing resist underlayer film is formed a photoresist film by using a chemically amplified resist composition, the photoresist film is exposed to a high energy beam after heat treatment, a positive pattern is formed by dissolving an exposed area of the photoresist film by using an alkaline developer, pattern transfer is made onto the silicon-containing resist underlayer film by dry-etching by using the photoresist film having the positive pattern as a mask, pattern transfer is made onto the organic hard mask by dry-etching by using the silicon-containing resist underlayer film having the transferred pattern as a mask, and then pattern transfer is made onto the body to be processed by dry-etching by using the organic hard mask having the transferred pattern as a mask.

When patterning is done by a positive development using the composition of the present invention for a resist underlayer film, by optimizing combination with the CVD film or the organic underlayer film in the way as mentioned above, a pattern formed with a photoresist can be formed on a substrate without causing size difference.

In addition, in photo-exposure of the photoresist film, it is preferable that change of the contact angle in a part of the silicon-containing resist underlayer film corresponding to an unexposed area of the exposed photoresist film is 10 degree or less as compared with before photo-exposure.

If change amount of the contact angle is like this, difference of contact angles between an unexposed area of the exposed photoresist film and a part of the silicon-containing resist underlayer film corresponding to this unexposed area of the exposed photoresist film becomes 10 degrees or less thereby leading to good adhesion in the positive development; and as a result, a fine pattern can be formed.

Further, the present invention provides a patterning process, wherein an organic underlayer film is formed on a body to be processed by using an application-type composition for the organic underlayer film, on this organic underlayer film is formed a silicon-containing resist underlayer film by using the composition for forming the silicon-containing resist underlayer film, on this silicon-containing resist underlayer film is formed a photoresist film by using a chemically amplified resist composition, the photoresist film is exposed to a high energy beam after heat treatment, a negative pattern is formed by dissolving an unexposed area of the photoresist film by using an organic solvent developer, pattern transfer is made onto the silicon-containing resist underlayer film by dry-etching by using the photoresist film having the negative pattern as a mask, pattern transfer is made onto the organic underlayer film by dry-etching by using the silicon-containing resist underlayer film having the transferred pattern as a mask, and then pattern transfer is made onto the body to be processed by dry-etching by using the organic underlayer film having the transferred pattern as a mask.

In addition, the present invention provides a patterning process, wherein an organic hard mask mainly comprising carbon is formed on a body to be processed by a CVD method, on this organic hard mask is formed a silicon-containing resist underlayer film by using the composition for forming the silicon-containing resist underlayer film, on this silicon-containing resist underlayer film is formed a photoresist film by using a chemically amplified resist composition, the photoresist film is exposed to a high energy beam after heat treatment, a negative pattern is formed by dissolving an unexposed area of the photoresist film by using an organic solvent developer, pattern transfer is made onto the silicon-containing resist underlayer film by dry-etching by using the photoresist film having the negative pattern as a mask, pattern transfer is made onto the organic hard mask by dry-etching by using the silicon-containing resist underlayer film having the transferred pattern as a mask, and then pattern transfer is made onto the body to be processed by dry-etching by using the organic hard mask having the transferred pattern as a mask.

When a negative pattern is formed by using the composition of the present invention for forming a silicon-containing resist underlayer film, by optimizing combination with the CVD film or the organic underlayer film in the way as mentioned above, a pattern formed with a photoresist can be formed on a substrate without causing size difference.

Further, in photo-exposure of the photoresist film, it is preferable that the contact angle of a part of the silicon-containing resist underlayer film corresponding to an exposed area of the exposed photoresist film is decreased by 10 degrees or more after photo-exposure as compared with before photo-exposure.

The contact angle of the resist pattern after photo-exposure is shifted toward a hydrophilic side, i.e., a lower side than before the photo-exposure; and thus, if the contact angle of the part of the silicon-containing resist underlayer film corresponding to the exposed area of the exposed photoresist film is lowered by 10 degrees or more as compared with before photo-exposure, difference with the contact angle of the resist pattern after the negative development becomes small thereby enhancing adhesion and prohibiting pattern fall; and as a result, a fine pattern can be formed.

In addition, in the negative patterning process and the positive patterning process, it is preferable that the body to be processed is a substrate for a semiconductor device, or the substrate for a semiconductor device coated, as a layer to be processed, with any of a metal film, a metal carbide film, a metal oxide film, a metal nitride film, a metal oxycarbide film, and a metal oxynitride film.

Further, in the negative patterning process and the positive patterning process, it is preferable that the metal that constitutes the body to be processed is silicon, titanium, tungsten, hafnium, zirconium, chromium, germanium, copper, aluminum, iron, or an alloy of these metals.

According to the patterning process of the present invention, a pattern can be formed by processing the body to be processed as mentioned above.

When the resist underlayer film formed by using the composition of the present invention for forming a silicon-containing resist underlayer film is used, a resist pattern with excellent adhesion with the resist underlayer film, without pattern fall and with good surface roughness can be obtained in both the positive development (alkaline development) and the negative development (organic solvent development). In addition, in this resist underlayer film, high etching selectivity with an organic material can be obtained; and thus, the formed photoresist pattern can be transferred successively to the silicon-containing resist underlayer film and then to the organic underlayer film or the CVD organic hard mask by using a dry etching process. Especially as the manufacturing process of a semiconductor device is progressing toward further miniaturization in recent years, in order to prohibit pattern fall after development, a thickness of the photoresist film is prone to thinner whereby pattern transfer to the resist underlayer film is becoming difficult. However, if the composition of the present invention for forming a silicon-containing resist underlayer film is used, deformation of the photoresist pattern during dry etching can be suppressed even if a thin photoresist film is used as an etching mask, so that this pattern can be transferred to a substrate with high precision.

In addition, in practical manufacturing process of a semiconductor device, all the patterning processes are not changed from the positive development to the negative development, but only part of an ultrafine process is changed; and thus, it may be assumed that the existing positive development process remains unchanged. In this case, if a resist underlayer film solely dedicated to each the negative development and the positive development are used, equipment may become complicated and quality control may become cumbersome. Accordingly, when a composition for forming a silicon-containing resist underlayer film usable in both the positive and the negative processes, like the one in the present invention, is used, rational management may be possible in both equipment and quality control.

BRIEF DESCRIPTION OF THE DRAWING

FIG. 1 is a flow chart showing one embodiment of a patterning process according to the present invention.

DESCRIPTION OF THE PREFERRED EMBODIMENTS

In a positive photoresist, conventionally, film properties of the photoresist film before photo-exposure and film properties of the pattern formed by an alkaline development after photo-exposure (hereinafter this pattern is called "positive pattern") have been the same. And thus, to enhance adhesion of the positive pattern with the resist underlayer film, contact angle of the photoresist to pure water and contact angle of the resist underlayer film to pure water (hereinafter "contact angle to pure water" is called "contact angle") were approximated; and this approach has been effective to enhance adhesion of the positive pattern with the resist underlayer film and to lower the roughness as well.

However, in the pattern obtained by a negative development (hereinafter, this pattern is called "negative pattern"), when comparison is made on film properties between the photoresist film before photo-exposure and the negative pattern after photo-exposure, in the negative pattern, an acid-labile group is eliminated by an acid generated by the photo-exposure thereby increasing amount of hydrophilic groups such as a carboxyl group and a phenolic hydroxyl group; and as a result, the contact angle is shifted toward a more hydrophilic side, i.e., a lower side, than that of the photoresist film before the photo-exposure. Because of this, it was found, in the patterning process in which both the negative development and the positive development are used, when a conventional resist underlayer film for a positive development whose contact angle is made coincident with that of a photoresist film before the photo-exposure is used as it is, discrepancy from the contact angle of the negative pattern after the photo-exposure is generated thereby causing fall of the negative pattern and an adverse effect in roughness.

Accordingly, inventors of the present invention found that, by utilizing the fact that the positive pattern is the unexposed photoresist film area and the negative pattern is the exposed photoresist film area, if the contact angle before the photo-exposure was approximated to the contact angle of the unexposed photoresist film part to pure water and the contact angle in the exposed area was approximated to the contact angle of the resist film after the photo-exposure, the resist underlayer film having optimum surface conditions in any of the processes could be obtained. With this finding, the inventors carried out extensive investigation on a composition for forming a silicon-containing resist underlayer film whose contact angle decreases only in the exposed area; and as a result, the inventors found that, when a polymer having an acid-labile group and a polymer not having this group were blended in an appropriate mixing ratio, a composition for forming a silicon-containing resist underlayer film whose contact angle decreased only in the exposed area could be obtained thereby accomplishing the present invention.

In addition, by controlling the constituting element in the resist underlayer film containing an organic group which is a driving force to change the contact angle of the resist underlayer film part corresponding to the exposed area of the photoresist film, etching selectivity with the photoresist film could be optimized so that both etching performance and patterning performance could be satisfied.

In the composition of the present invention for forming a silicon-containing resist underlayer film, when a silicon-containing compound containing a hydroxyl group or a carboxyl group, the groups being substituted with an acid-labile group, is mixed as the component (A) with a silicon-containing compound having excellent etching selectivity with the photoresist as the component (B), whereby localizing the component (A) on surface of the resist underlayer film, respective optimum surface contact angles during the time of the positive development and the negative development can be realized. Hereinafter, detailed explanation thereof will be described.

Component (A)

The composition of the present invention for forming a silicon-containing resist underlayer film contains, as the component (A), a silicon-containing compound obtained by a hydrolysis-condensation reaction of a mixture containing, at least, one or more hydrolysable silicon compound shown by the following general formula (1) and one or more hydrolysable compound shown by the following general formula (2), $$R^1_{m1}R^2_{m2}R^3_{m3}Si(OR)_{(4-m1-m2-m3)} \quad (1)$$

wherein, R represents a hydrocarbon group having 1 to 6 carbon atoms; and at least one of $R^1$, $R^2$, and $R^3$ is an organic group containing a hydroxyl group or a carboxyl group, the groups being substituted with an acid-labile group, while the other is a hydrogen atom or a monovalent organic group having 1 to 30 carbon atoms. m1, m2, and m3 represent 0 or 1 and satisfy $1 \leq m1+m2+m3 \leq 3$, $$U(OR^4)_{m4}(OR^5)_{m5} \quad (2)$$

wherein, $R^4$ and $R^5$ represent an organic group having 1 to 30 carbon atoms, and m4+m5 is the same number as the number determined by valency of U. m4 and m5 represent an integer of 0 or more, and the U is an element belonging to groups of III, IV, or V in a periodic table except for carbon and silicon.

As to the hydrolysable silicon compound shown by the general formula (1) used as a raw material of the component (A), the compound containing two or three hydrolysable groups selected from a methoxy group, an ethoxy group, a propoxy group, and a butoxy group that are bonded to the silicon atom, as shown in the following structures, may be used.

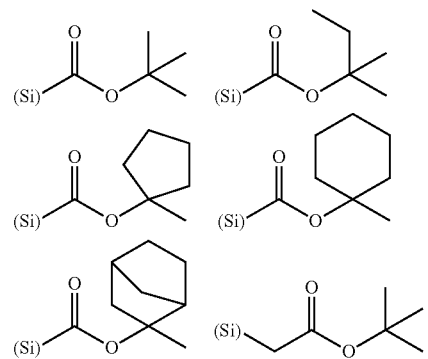

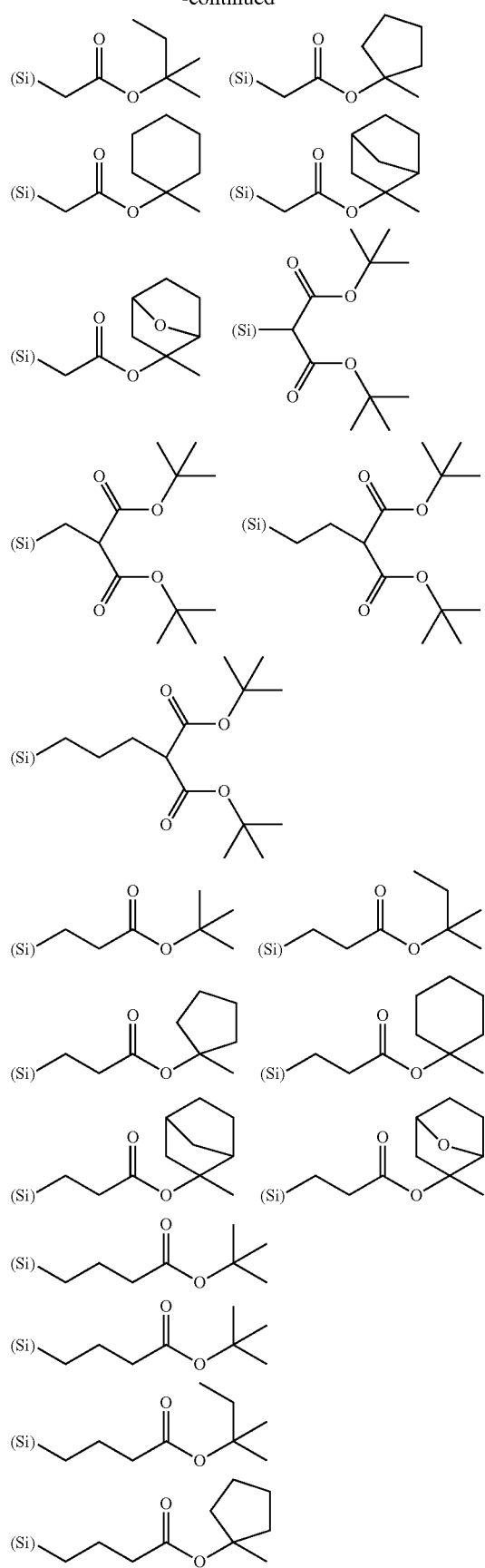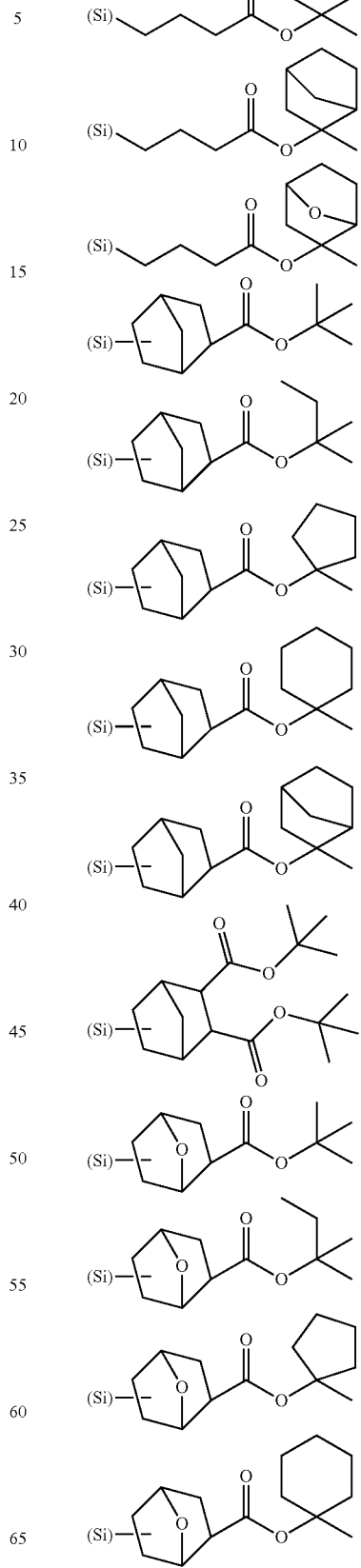

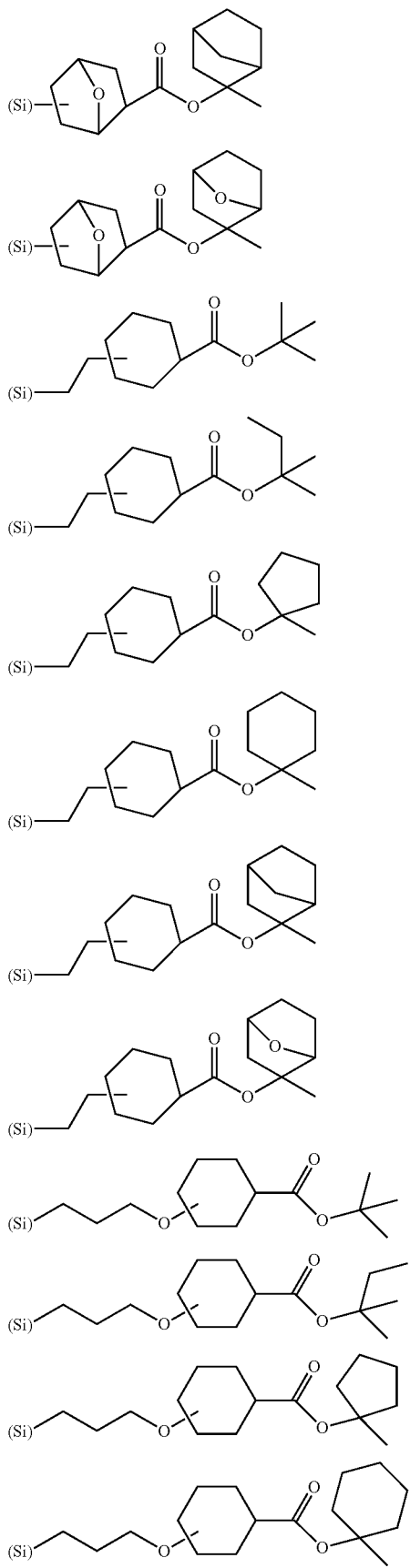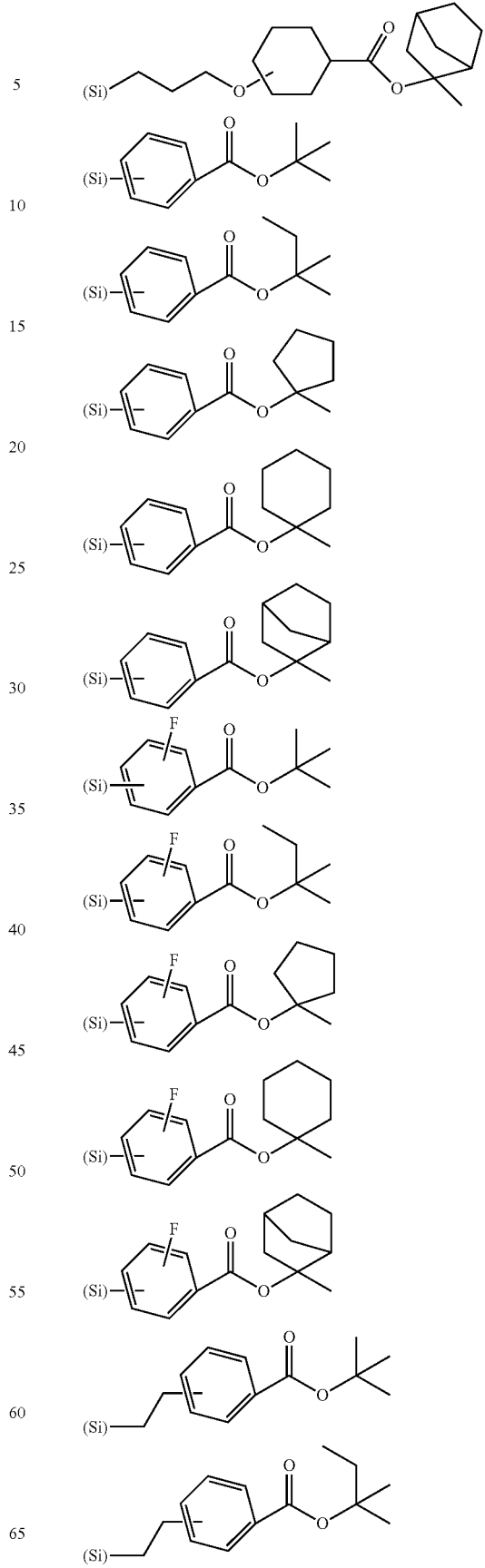

-continued
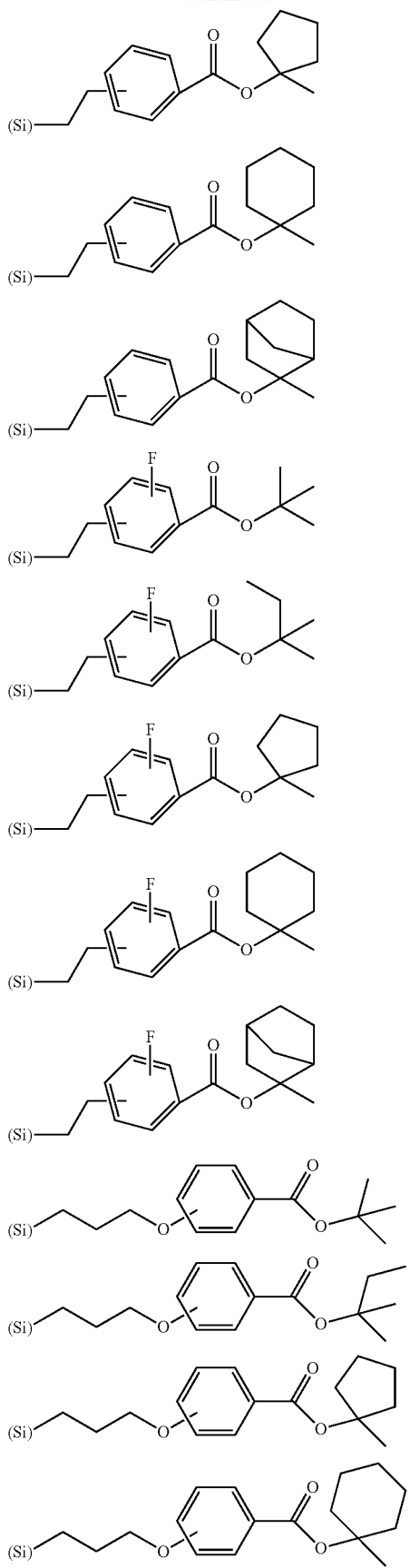
-continued
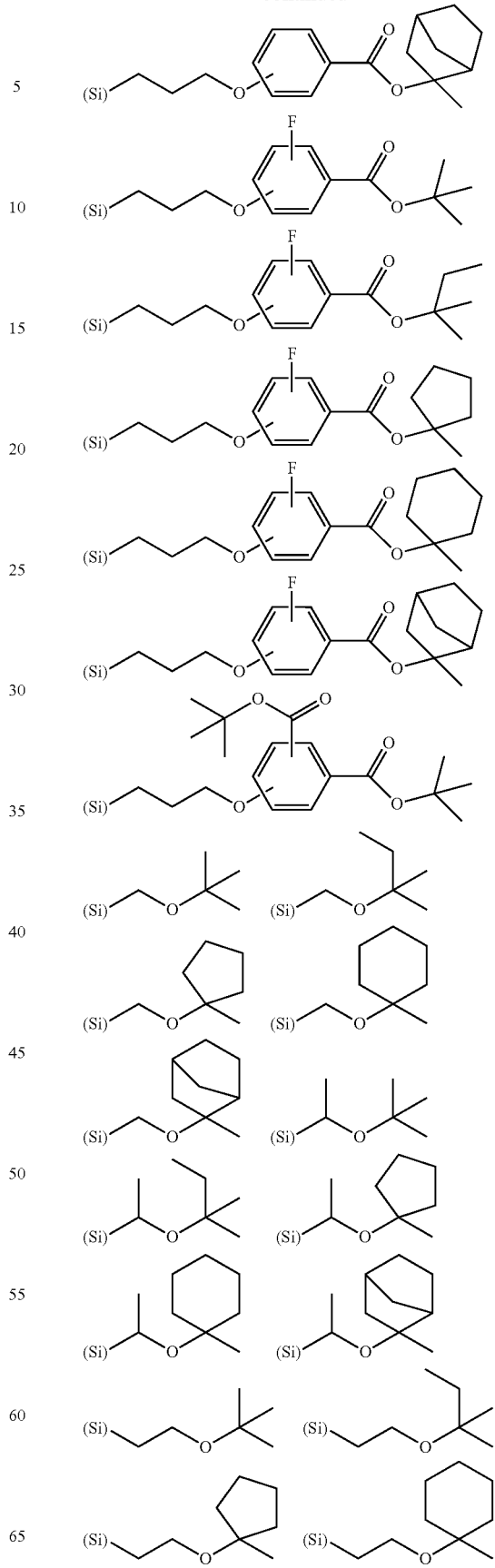

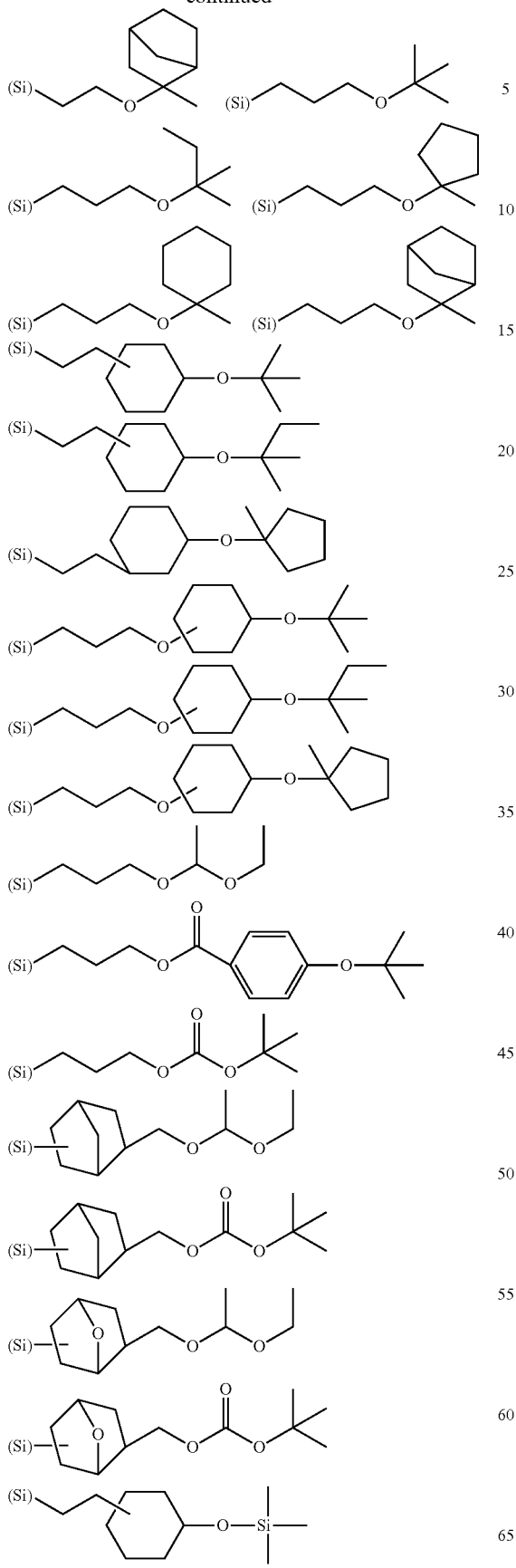
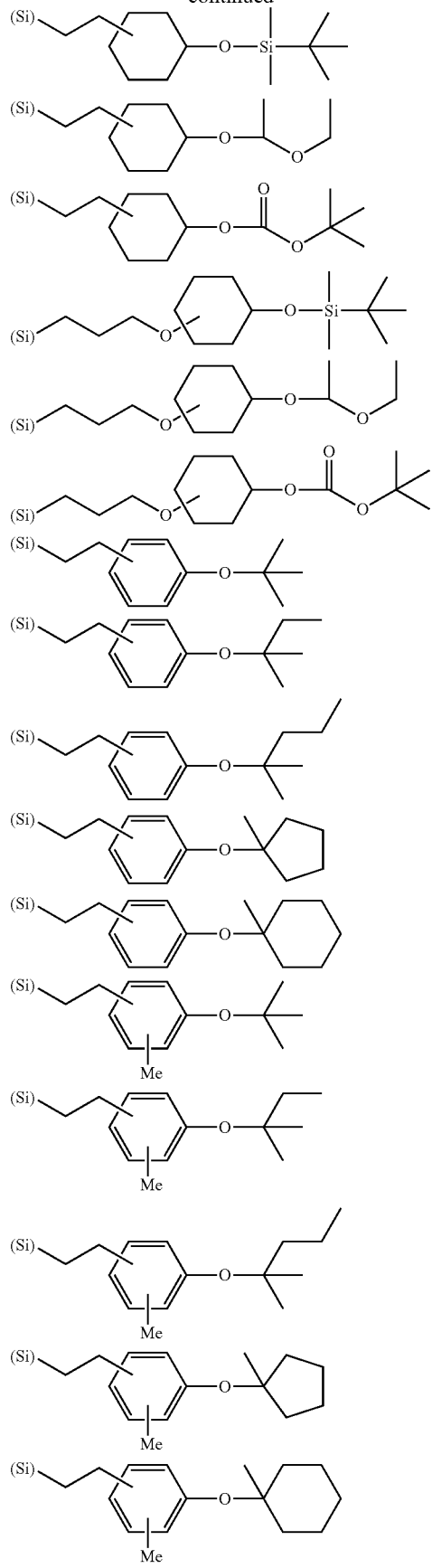

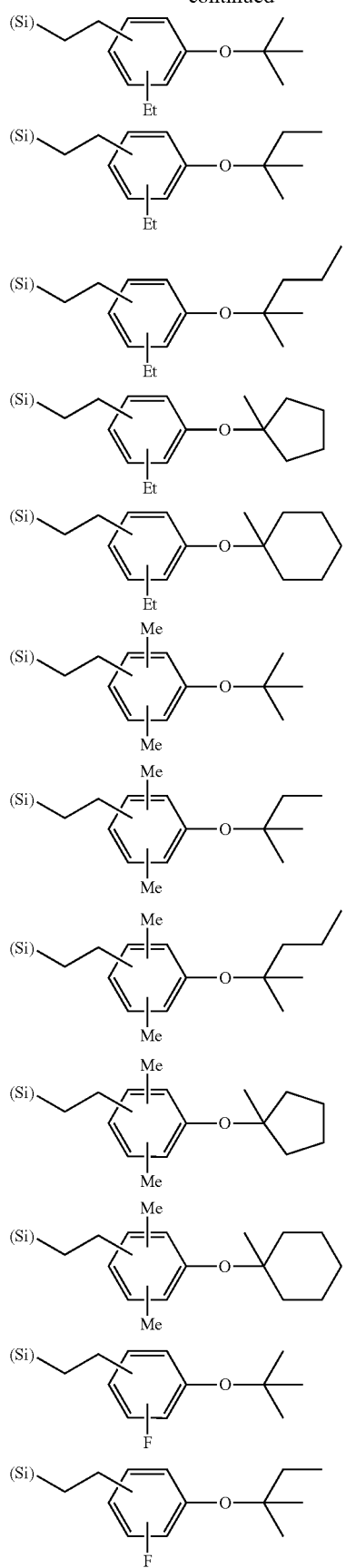
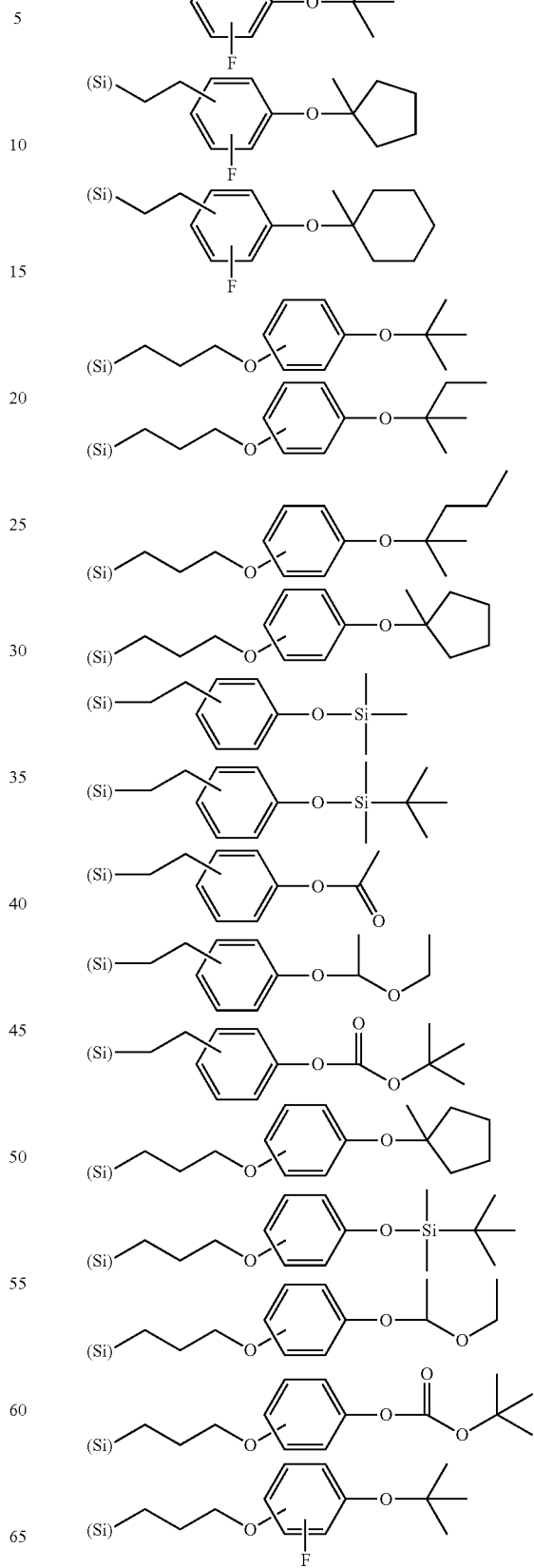

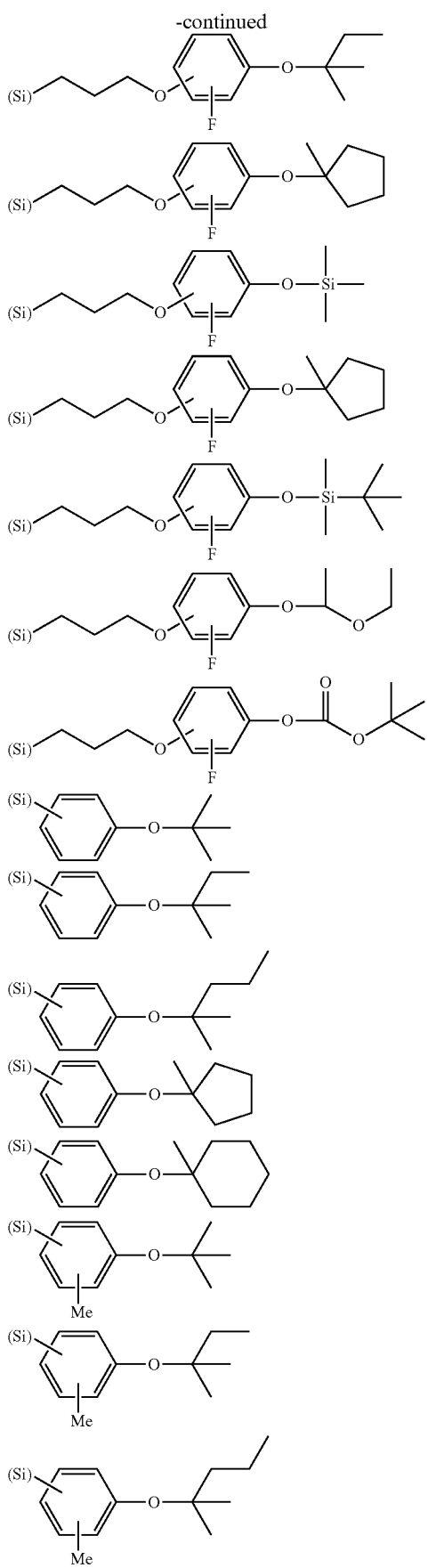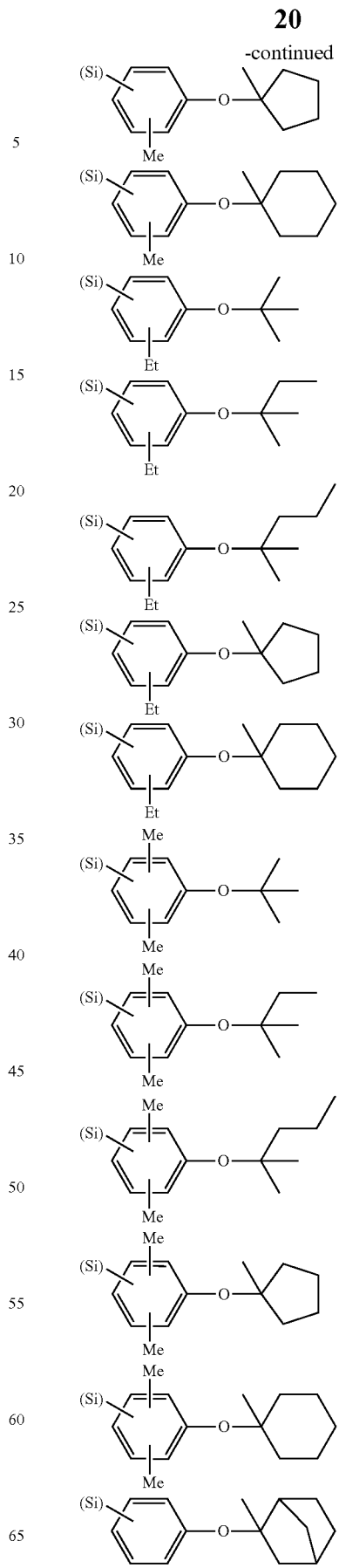

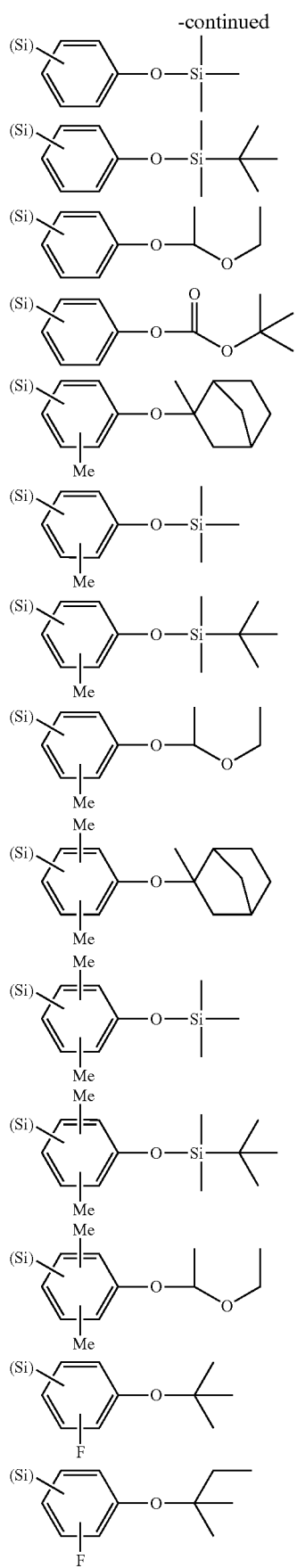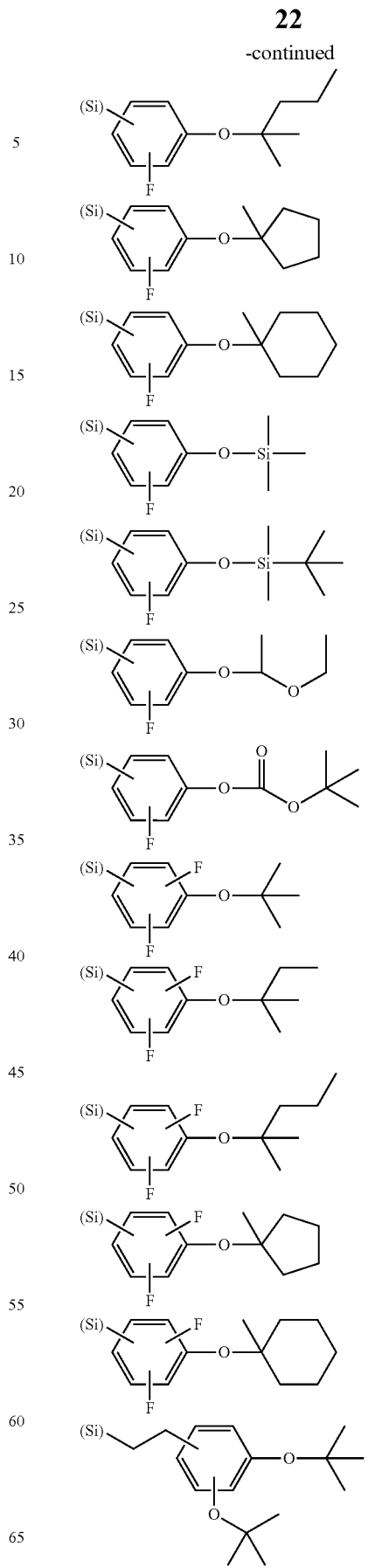

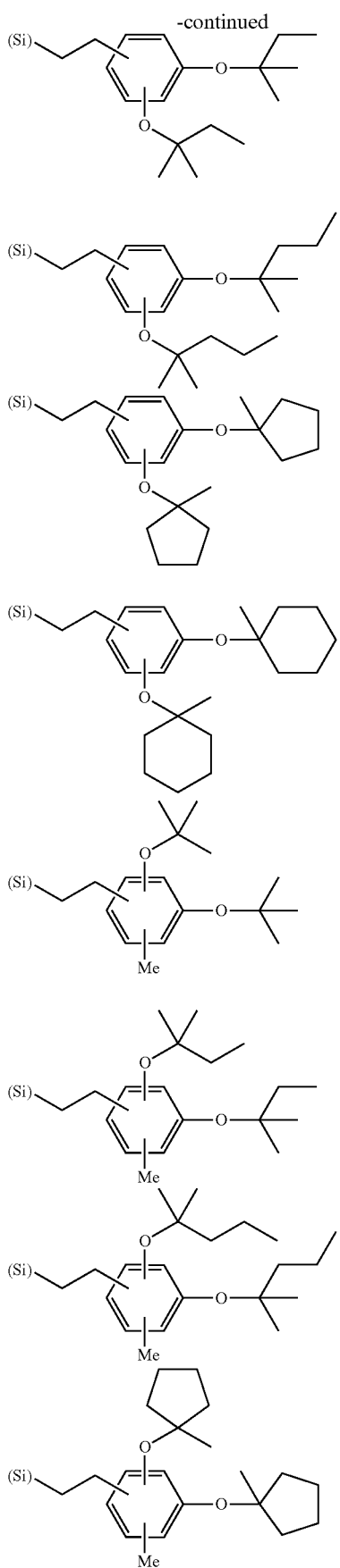
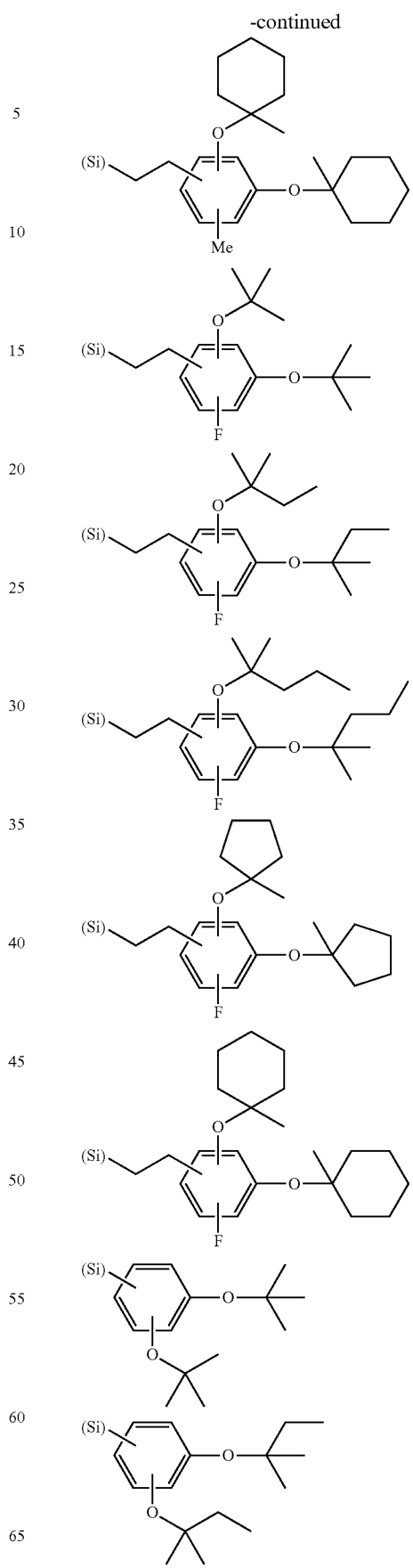

-continued

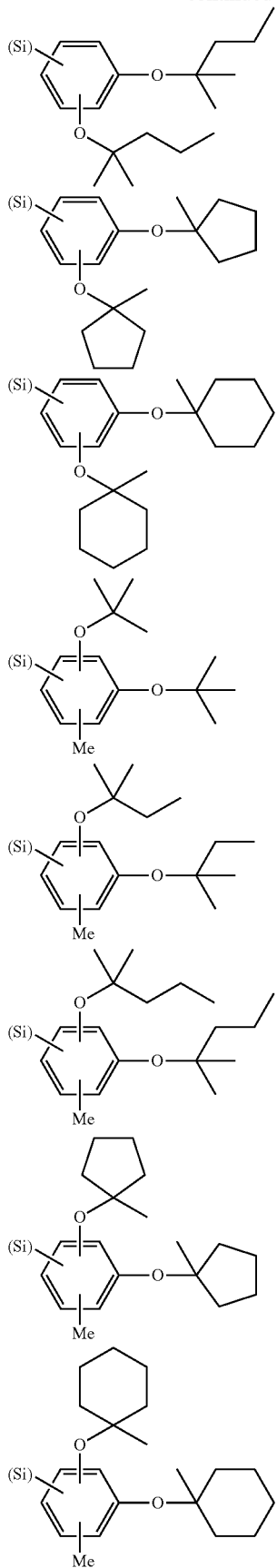

-continued

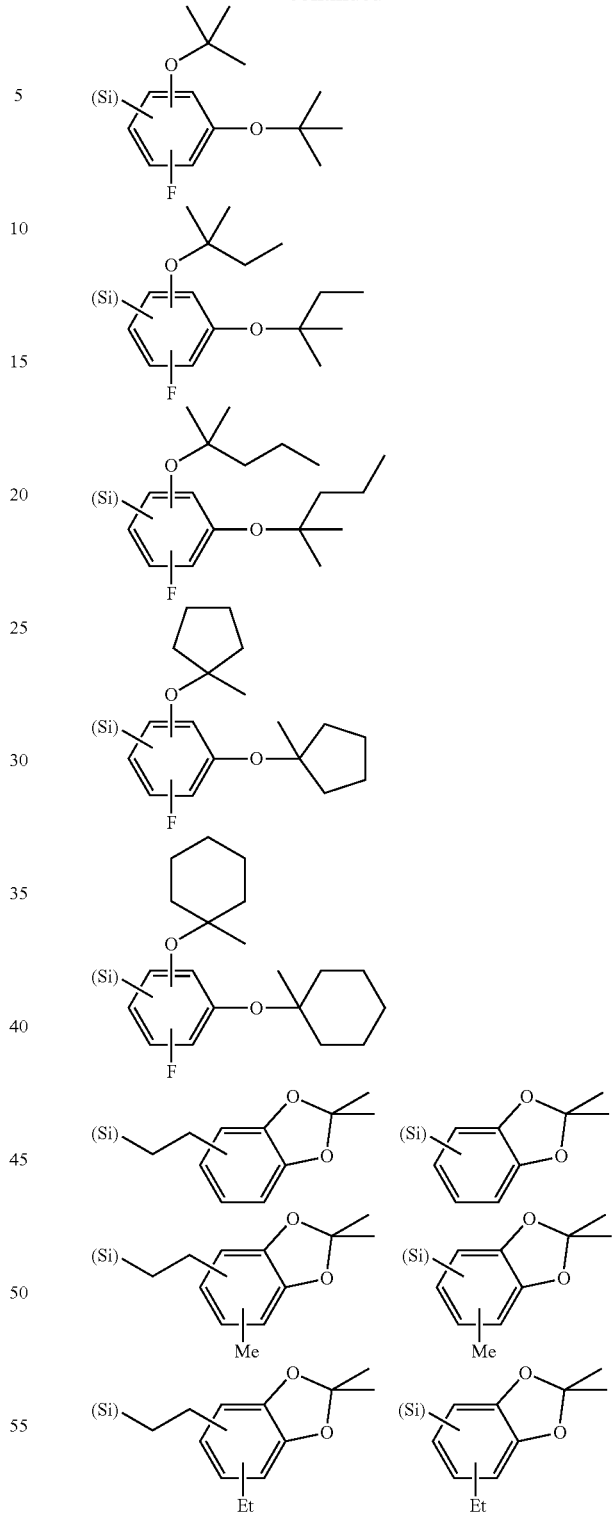

As to the hydrolysable compound shown by the general formula (2) used as a raw material of the component (A), the followings may be mentioned. In the case that the U is boron, illustrative examples of the hydrolysable compound shown by the general formula (2) include, as monomers, boron methoxide, boron ethoxide, boron propoxide, boron butoxide, boron amyloxide, boron hexyloxide, boron cyclopentoxide, boron cyclohexloxide, boron allyloxide, boron phenoxide, boron methoxyethoxide, boric acid, and boron oxide.

When U is aluminum, examples of the hydrolysable compound shown by the formula (2) include, as monomers, aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum methoxyethoxide, aluminum ethoxyethoxide, aluminum dipropoxyethyl-acetoacetate, aluminum dibutoxy-ethyl-acetoacetate, aluminum propoxy-bis-ethyl-acetoacetate, aluminum butoxy-bis-ethyl-acetoacetate, aluminum 2,4-pentanedionate, and aluminum 2,2,6,6-tetramethyl-3,5-heptanedionate.

When U is gallium, examples of the hydrolysable compound shown by the formula (2) include, as monomers, gallium methoxide, gallium ethoxide, gallium propoxide, gallium butoxide, gallium amyloxide, gallium hexyloxide, gallium cyclopentoxide, gallium cyclohexyloxide, gallium allyloxide, gallium phenoxide, gallium methoxyethoxide, gallium ethoxyethoxide, gallium dipropoxyethyl-acetoacetate, gallium dibutoxyethyl-acetoacetate, gallium propoxy-bis-ethyl-acetoacetate, gallium butoxy-bis-ethyl-acetoacetate, gallium 2,4-pentanedionate, and gallium 2,2,6,6-tetramethyl-3,5-heptanedionate.

When U is yttrium, examples of the hydrolysable compound shown by the formula (2) include, as monomers, yttrium methoxide, yttrium ethoxide, yttrium propoxide, yttrium butoxide, yttrium amyloxide, yttrium hexyloxide, yttrium cyclopentoxide, yttrium cyclohexyloxide, yttrium allyloxide, yttrium phenoxide, yttrium methoxyethoxide, yttrium ethoxyethoxide, yttrium dipropoxyethyl-acetoacetate, yttrium dibutoxyethyl-acetoacetate, yttrium propoxy-bis-ethyl-acetoacetate, yttrium butoxy-bis-ethyl-acetoacetate, yttrium 2,4-pentanedionate, and yttrium 2,2,6,6-tetramethyl-3,5-heptanedionate.

When U is germanium, examples of the hydrolysable compound shown by the formula (2) include, as monomers, germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, germanium methoxyethoxide, and germanium ethoxyethoxide.

When U is titanium, examples of the hydrolysable compound shown by the formula (2) include, as monomers, titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxy-bisethyl-acetoacetate, titanium dibutoxy-bisethyl-acetoacetate, titanium dipropoxy-bis-2,4-pentanedionate, and titanium dibutoxy-bis-2,4-pentanedionate.

When U is hafnium, examples of the hydrolysable compound shown by the formula (2) include, as monomers, hafnium methoxide, hafnium ethoxide, hafnium propoxide, hafnium butoxide, hafnium amyloxide, hafnium hexyloxide, hafnium cyclopentoxide, hafnium cyclohexyloxide, hafnium allyloxide, hafnium phenoxide, hafnium methoxyethoxide, hafnium ethoxyethoxide, hafnium dipropoxy-bisethyl-acetoacetate, hafnium dibutoxy-bisethyl-acetoacetate, hafnium dipropoxy-bis-2,4-pentanedionate, and hafnium dibutoxy-bis-2,4-pentanedionate.

When U is tin, examples of the hydrolysable compound shown by the formula (2) include, as monomers, methoxy tin, ethoxy tin, propoxy tin, butoxy tin, phenoxy tin, methoxy-ethoxy tin, ethoxyethoxy tin, tin 2,4-pentanedionate, and tin 2,2,6,6-tetramethyl-3,5-heptanedionate.

When U is arsenic, examples of the hydrolysable compound shown by the formula (2) include, as monomers, methoxy arsenic, ethoxy arsenic, propoxy arsenic, butoxy arsenic, and phenoxy arsenic.

When U is antimony, examples of the hydrolysable compound shown by the formula (2) include, as monomers, methoxy antimony, ethoxy antimony, propoxy antimony, butoxy antimony, phenoxy antimony, antimony acetate, and antimony propionate.

When U is niobium, examples of the hydrolysable compound shown by the formula (2) include, as monomers, methoxy niobium, ethoxy niobium, propoxy niobium, butoxy niobium, and phenoxy niobium.

When U is tantalum, examples of the hydrolysable compound shown by the formula (2) include, as monomers, methoxy tantalum, ethoxy tantalum, propoxy tantalum, butoxy tantalum, and phenoxy tantalum.

When U is bismuth, examples of the hydrolysable compound shown by the formula (2) include, as monomers, methoxy bismuth, ethoxy bismuth, propoxy bismuth, butoxy bismuth, and phenoxy bismuth.

When U is phosphorus, examples of the compounds represented by the formula (2) include, as monomers, trimethyl phosphite, triethyl phosphite, tripropyl phosphite, and diphosphorus pentoxide.

When U is vanadium, examples of the compounds represented by the formula (2) include, as monomers, vanadium oxide-bis(2,4-pentanedionate), vanadium 2,4-pentanedionate, vanadium tributoxide oxide, and vanadium tripropoxide oxide.

When U is zirconium, examples of the compounds represented by the formula (2) include, as monomers, methoxy zirconium, ethoxy zirconium, propoxy zirconium, butoxy zirconium, phenoxy zirconium, zirconium dibutoxide-bis(2,4-pentanedionate), and zirconium dipropoxide-bis(2,2,6,6-tetramethyl-3,5-heptanedionate).

In the present invention, by introducing the foregoing elements as U of the general formula (2), etching selectivity between the photoresist film and the resist underlayer film formed by the composition of the present invention can be optimized; and as a result, a composition formable the resist underlayer film having excellent size stability during processing by dry etching can be obtained.

In addition, compounds shown by the general formulae (3) and (4) used as raw materials of the component (B) as mentioned later may be used as a part of raw materials of the component (A).

Amount of the general formula (1) in the component (A) is preferably 5% or more by mole, or more preferably 10% or more by mole. Amount of the general formula (2) in the component (A) is preferably 10% or more by mole, or more preferably 20% or more by mole. Amount of the general formulae (1) and (2) in the component (A) is preferably 50% or more by mole, or more preferably 55% or more by mole.

Component (B)

The composition of the present invention for forming a silicon-containing resist underlayer film contains, as the component (B), a silicon-containing compound obtained by a hydrolysis-condensation reaction of a mixture containing, at least, one or more hydrolysable silicon compound shown by the following general formula (3) and one or more hydrolysable silicon compound shown by the following general formula (4). Component (B) is not particularly restricted, but the component preferably does not contain a hydroxyl group or a carboxyl group, the groups being substituted with an acid-labile group,

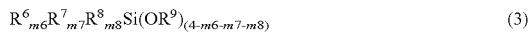  (3)

wherein, $R^9$ represents an alkyl group having 1 to 6 carbon atoms, and each $R^6$, $R^7$, and $R^8$ represents a hydrogen atom or a monovalent organic group having 1 to 30 carbon atoms. m6, m7, and m8 represent 0 or 1 and satisfy $1 \leq m6+m7+m8 \leq 3$,

  (4)

wherein, $R^{10}$ represents an alkyl group having 1 to 6 carbon atoms.

As to the compound shown by the general formula (3) used as a raw material of the component (B), following compounds may be mentioned as illustrative examples thereof.

Examples thereof include trimethoxysilane, triethoxysilane, tripropoxysilane, triisopropoxysilane, methyltrimethoxysilane, methyltriethoxysilane, methyltripropoxysilane, methyltriisopropoxysilane, ethyltrimethoxysilane, ethyltriethoxysilane, ethyltripropoxysilane, ethyltriisopropoxysilane, vinyltrimethoxysilane, vinyltriethoxysilane, vinyltripropoxysilane, vinyltriisopropoxysilane, propyltrimethoxysilane, propyltriethoxysilane, propyltripropoxysilane, propyltriisopropoxysilane, isopropyltrimethoxysilane, isopropyltriethoxysilane, isopropyltripropoxysilane, isopropyltriisopropoxysilane, butyltrimethoxysilane, butyltriethoxysilane, butyltripropoxysilane, butyltriisopropoxysilane, sec-butyltrimethoxysilane, sec-butyltriethoxysilane, sec-butyltripropoxysilane, sec-butyltriisopropoxysilane, t-butyltrimethoxysilane, t-butyltriethoxysilane, t-butyltripropoxysilane, t-butyltriisopropoxysilane, cyclopropyltrimethoxysilane, cyclopropyltriethoxysilane, cyclopropyltripropoxysilane, cyclopropyltriisopropoxysilane, cyclobutyltrimethoxysilane, cyclobutyltriethoxysilane, cyclobutyltripropoxysilane, cyclobutyltriisopropoxysilane, cyclopentyltrimethoxysilane, cyclopentyltriethoxysilane, cyclopentyltripropoxysilane, cyclopentyltriisopropoxysilane, cyclohexyltrimethoxysilane, cyclohexyltriethoxysilane, cyclohexyltripropoxysilane, cyclohexyltriisopropoxysilane, cyclohexenyltrimethoxysilane, cyclohexenyltriethoxysilane, cyclohexenyltripropoxysilane, cyclohexenyltriisopropoxysilane, cyclohexenylethyltrimethoxysilane, cyclohexenylethyltriethoxysilane, cyclohexenylethyltripropoxysilane, cyclohexenylethyltriisopropoxysilane, cyclooctyltrimethoxysilane, cyclooctyltriethoxysilane, cyclooctyltripropoxysilane, cyclooctyltriisopropoxysilane, cyclopentadienylpropyltrimethoxysilane, cyclopentadienylpropyltriethoxysilane, cyclopentadienylpropyltripropoxysilane, cyclopentadienylpropyltriisopropoxysilane, bicycloheptenyltrimethoxysilane, bicycloheptenyltriethoxysilane, bicycloheptenyltripropoxysilane, bicycloheptenyltriisopropoxysilane, bicycloheptyltrimethoxysilane, bicycloheptyltriethoxysilane, bicycloheptyltripropoxysilane, bicycloheptyltriisopropoxysilane, adamantyltrimethoxysilane, adamantyltriethoxysilane, adamantyltripropoxysilane, adamantyltriisopropoxysilane, phenyltrimethoxysilane, phenyltriethoxysilane, phenyltripropoxysilane, phenyltriisopropoxysilane, benzyltrimethoxysilane, benzyltriethoxysilane, benzyltripropoxysilane, benzyltriisopropoxysilane, anisyltrimethoxysilane, anisyltriethoxysilane, anisyltripropoxysilane, anisyltriisopropoxysilane, tolyltrimethoxysilane, tolyltriethoxysilane, tolyltripropoxysilane, tolyltriisopropoxysilane, phenethyltrimethoxysilane, phenethyltriethoxysilane, phenethyltripropoxysilane, phenethyltriisopropoxysilane, naphthyltrimethoxysilane, naphthyltriethoxysilane, naphthyltripropoxysilane, naphthyltriisopropoxysilane, dimethyldimethoxysilane, dimethyldiethoxysilane, methylethyldimethoxysilane, methylethyldiethoxysilane, dimethyldipropoxysilane, dimethyldiisopropoxysilane, diethyldimethoxysilane, diethyldiethoxysilane, diethyldipropoxysilane, diethyldiisopropoxysilane, dipropyldimethoxysilane, dipropyldiethoxysilane, dipropyldipropoxysilane, dipropyldiisopropoxysilane, diisopropyldimethoxysilane, diisopropyldiethoxysilane, diisopropyldipropoxysilane, diisopropyldiisopropoxysilane, dibutyldimethoxysilane, dibutyldiethoxysilane, dibutyldipropoxysilane, dibutyldiisopropoxysilane, di-sec-butyldimethoxysilane, di-sec-butyldiethoxysilane, di-sec-butyldipropoxysilane, di-sec-butyldiisopropoxysilane, di-t-butyldimethoxysilane, di-t-butyldiethoxysilane, di-t-butyldipropoxysilane, di-t-butyldiisopropoxysilane, dicyclopropyldimethoxysilane, dicyclopropyldiethoxysilane, dicyclopropyldipropoxysilane, dicyclopropyldiisopropoxysilane, dicyclobutyldimethoxysilane, dicyclobutyldiethoxysilane, dicyclobutyldipropoxysilane, dicyclobutyldiisopropoxysilane, dicyclopentyldimethoxysilane, dicyclopentyldiethoxysilane, dicyclopentyldipropoxysilane, dicyclopentyldiisopropoxysilane, dicyclohexyldimethoxysilane, dicyclohexyldiethoxysilane, dicyclohexyldipropoxysilane, dicyclohexyldiisopropoxysilane, dicyclohexenyldimethoxysilane, dicyclohexenyldiethoxysilane, dicyclohexenyldipropoxysilane, dicyclohexenyldiisopropoxysilane, dicyclohexenylethyldimethoxysilane, dicyclohexenylethyldiethoxysilane, dicyclohexenylethyldipropoxysilane, dicyclohexenylethyldiisopropoxysilane, dicyclooctyldimethoxysilane, dicyclooctyldiethoxysilane, dicyclooctyldipropoxysilane, dicyclooctyldiisopropoxysilane, dicyclopentadienylpropyldimethoxysilane, dicyclopentadienylpropyldiethoxysilane, dicyclopentadienylpropyldipropoxysilane, dicyclopentadienylpropyldiisopropoxysilane, bisbicycloheptenyldimethoxysilane, bisbicycloheptenyldiethoxysilane, bisbicycloheptenyldipropoxysilane, bisbicycloheptenyldiisopropoxysilane, bisbicycloheptyldimethoxysilane, bisbicycloheptyldiethoxysilane, bisbicycloheptyldipropoxysilane, bisbicycloheptyldiisopropoxysilane, diadamantyldimethoxysilane, diadamantyldiethoxysilane, diadamantyldipropoxysilane, diadamantyldiisopropoxysilane, diphenyldimethoxysilane, diphenyldiethoxysilane, methylphenyldimethoxysilane, methylphenyldiethoxysilane, diphenyldipropoxysilane, diphenyldiisopropoxysilane, trimethylmethoxysilane, trimethylethoxysilane, dimethylethylmethoxysilane, dimethylethylethoxysilane, dimethylphenylmethoxysilane, dimethylphenylethoxysilane, dimethylbenzylmethoxysilane, dimethylbenzylethoxysilane, dimethylphenethylmethoxysilane, and dimethylphenethylethoxysilane.

Examples of the compound shown by the general formula (4) used as a raw material of the component (B) include tetramethoxysilane, tetraethoxysilane, tetrapropoxysilane, tetraisopropoxysilane.

Preferable examples among them include tetramethoxysilane, tetraethoxysilane methyltrimethoxysilane, methyltriethoxysilane, ethyltrimethoxysilane, ethyltriethoxysilane, vinyltrimethoxysilane, vinyltriethoxysilane, propyltrimethoxysilane, propyltriethoxysilane, isopropyltrimethoxysilane, isopropyltriethoxysilane, butyltrimethoxysilane, butyltriethoxysilane, isobutyltrimethoxysilane, isobutyltriethoxysilane, allyltrimethoxysilane, allyltriethoxysilane, cyclopentyltrimethoxysilane, cyclopentyltriethoxysilane, cyclohexyltrimethoxysilane, cyclohexyltriethoxysilane, cyclohexenyltrimethoxysilane, cyclohexenyltriethoxysilane, phenyltrimethoxysilane, phenyltriethoxysilane, benzyltrimethoxysilane, benzyltriethoxysilane, toryltrimethoxysilane, toryltriethoxysilane, anisyltrimethoxysilane, anisyltriethoxysilane, phenethyltrimethoxysilane, phenethyltriethoxysilane, dimethyldimethoxysilane, dimethyldiethoxysilane, diethyldimethoxysilane, diethyldiethoxysilane, methylethyldimethoxysilane, methylethyldiethoxysilane, dipropyldimethoxysilane, dibutyldimethoxysilane, methylphenyldimethoxysilane, methylphenyldiethoxysilane, trimethylmethoxysilane, dimethylethylmethoxysilane, dimethylphenylmethoxysilane, dimethylbenzylmethoxysilane, and dimethylphenethylmethoxysilane.

Of the constituting units derived from the general formula (3) and the general formula (4) in the component (B), mole ratio of the constituting unit derived from the general formula (4) is preferably 50% or more by mole, or more preferably 55% or more by mole. In addition, mass ratio of the component (A) to the component (B) is preferably (B)/(A)≥1. When the silicon-containing compounds used in the present invention are selected properly and used with proper mass ratio as mentioned above, a composition being capable of forming a silicon-containing resist underlayer film not only having excellent storage stability and adhesion property but also not changing patterning performance during the negative development and the positive development can be obtained.

Synthesis Methods of the Silicon-Containing Compounds

Raw material for the reaction to form the component (A) and the component (B) may be prepared by mixing, prior to or during the reaction, one or more compounds shown by the general formulae (1) to (4) (hereinafter, these compounds are merely called "monomer"). Hereinafter, the components (A) and (B) are collectively called "silicon-containing compound".

(Synthesis Method 1: Acid Catalyst)

The silicon-containing compound of the present invention can be produced, by conducting hydrolytic condensation between monomers, while adopting, as an acid catalyst, one or more kinds of compounds selected from inorganic acids, aliphatic sulfonic acids, and aromatic sulfonic acids.

Examples of the acid catalyst to be used at this time include hydrofluoric acid, hydrochloric acid, hydrobromic acid, sulfuric acid, nitric acid, perchloric acid, phosphoric acid, methanesulfonic acid, benzenesulfonic acid, and toluenesulfonic acid. The catalyst is used in an amount of $10^{-6}$ to 10 moles, preferably $10^{-5}$ to 5 moles, more preferably $10^{-4}$ to 1 mole, relative to 1 mole of monomers.

The amount of water upon obtainment of the silicon-containing compound from these monomers by hydrolytic condensation, is 0.01 to 100 moles, preferably 0.05 to 50 moles, and more preferably 0.1 to 30 moles, per mole of hydrolyzable substitutional groups bonded to the monomers. Addition amounts 100 moles or less are economical, due to small-sized apparatuses to be used for reactions.

As a manipulation manner, the monomers are added into an aqueous catalyst solution, to cause initiation of a hydrolytic condensation reaction. At this time, the organic solvent may be added into the aqueous catalyst solution, or monomers may have been diluted with the organic solvent, or both procedures may be performed. The reaction temperature is to be 0 to 100° C., preferably 5 to 80° C. It is a preferable manner to keep the temperature at 5 to 80° C. upon dropping of the monomers, and subsequently mature them at 20 to 80° C.

Preferable examples of organic solvents, which can be added into the aqueous catalyst solution or which can dilute the monomers, include methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methylamylketone, butane diol monomethyl ether, propylene glycol monomethyl ether, ethylene glycol monomethyl ether, butane diol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, and mixtures of them.

Water-soluble ones are preferable among them. Examples thereof include: alcohols such as methanol, ethanol, 1-propanol, and 2-propanol; polyvalent alcohols such as ethylene glycol and propylene glycol; polyvalent alcohol condensation derivatives such as butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether; acetone; acetonitrile; and tetrahydrofuran. Those having boiling points of 100° C. or lower are especially preferable among them.

Meanwhile, amount of the organic solvent to be used is preferably in the range of 0 to 1000 mL, or in particular 0 to 500 mL, relative to one mole of the monomer. Smaller amount of the organic solvent is more economical because a reactor volume becomes smaller.

Thereafter, neutralization reaction of the catalyst is conducted if necessary, thereby obtaining an aqueous solution of reaction mixture. At this time, the amount of an alkaline substance usable for neutralization is preferably 0.1 to 2 equivalents relative to the acid used as the catalyst. This alkaline substance is arbitrary, insofar as the same exhibits alkalinity in water.

Subsequently, it is preferable to remove, from the reaction mixture, a by-product such as an alcohol formed by the hydrolysis condensation reaction by such a method as distillation under reduced pressure. In this removal procedure, a temperature to heat the reaction mixture is preferably 0 to 100° C., more preferably 10 to 90° C., or still more preferably 15 to 80° C., though depending on the organic solvent added, the alcohol formed by the reaction, and the like. The degree of evacuation during the removal procedure is preferably below an atmospheric pressure, more preferably 80 or less kPa by absolute pressure, or still more preferably 50 or less kPa by absolute pressure, though different depending on an exhausting equipment, a condensation equipment, a heating temperature, and an organic solvent, an alcohol, and the like to be removed. During this procedure, it is preferable that about 80% or more by mass of the total alcohol and the like formed is removed, though it is difficult to know exactly the amount of removed alcohol.

Next, it is possible to remove the acid catalyst used for the hydrolytic condensation, from the reaction mixture. As a procedure for removing the acid catalyst, the reaction mixture is mixed with water, and the silicon-containing compound is extracted with an organic solvent. Suitable as an organic solvent to be used then, is one which allows for dissolution of the silicon-containing compound therein and which is separated in a two-layered manner from water upon mixing therewith. Examples thereof include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methylamylketone, butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, methyl isobutyl ketone, cyclopentyl methyl ether, and mixtures thereof.

It is also possible to use a mixture of a water-soluble organic solvent and a water hardly-soluble organic solvent. Examples of preferable mixtures include, without limited thereto, combinations of methanol+ethyl acetate, ethanol+ ethyl acetate, 1-propanol+ethyl acetate, 2-propanol+ethyl acetate, butane diol monomethyl ether+ethyl acetate, propylene glycol monomethyl ether+ethyl acetate, ethylene glycol monomethyl ether+ethyl acetate, butane diol monoethyl ether+ethyl acetate, propylene glycol monoethyl ether+ethyl acetate, ethylene glycol monoethyl ether+ethyl acetate, butane diol monopropyl ether+ethyl acetate, propylene glycol monopropyl ether+ethyl acetate, ethylene glycol monopropyl ether+ethyl acetate, methanol+methyl isobutyl ketone, ethanol+methyl isobutyl ketone, 1-propanol+methyl isobutyl ketone, 2-propanol+methyl isobutyl ketone, propylene glycol monomethyl ether+methyl isobutyl ketone, ethylene glycol monomethyl ether+methyl isobutyl ketone, propylene glycol monoethyl ether+methyl isobutyl ketone, ethylene glycol monoethyl ether+methyl isobutyl ketone, propylene glycol monopropyl ether+methyl isobutyl ketone, ethylene glycol monopropyl ether+methyl isobutyl ketone, methanol+cyclopentyl methyl ether, ethanol+cyclopentyl methyl ether, 1-propanol+cyclopentyl methyl ether, 2-propanol+cyclopentyl methyl ether, propylene glycol monomethyl ether+cyclopentyl methyl ether, ethylene glycol monomethyl ether+cyclopentyl methyl ether, propylene glycol monoethyl ether+cyclopentyl methyl ether, ethylene glycol monoethyl ether+cyclopentyl methyl ether, propylene glycol monopropyl ether+cyclopentyl methyl ether, ethylene glycol monopropyl ether+cyclopentyl methyl ether, methanol+propylene glycol methyl ether acetate, ethanol+propylene glycol methyl ether acetate, 1-propanol+propylene glycol methyl ether acetate, 2-propanol+propylene glycol methyl ether acetate, propylene glycol monomethyl ether+ propylene glycol methyl ether acetate, ethylene glycol monomethyl ether+propylene glycol methyl ether acetate, propylene glycol monoethyl ether+propylene glycol methyl ether acetate, ethylene glycol monoethyl ether+propylene glycol methyl ether acetate, propylene glycol monopropyl ether+propylene glycol methyl ether acetate, and ethylene glycol monopropyl ether+propylene glycol methyl ether acetate.

Note that although the mixing ratio of the water-soluble organic solvent and the water hardly-soluble organic solvent is to be appropriately selected, the water-soluble organic solvent is selected to be 0.1 to 1,000 parts by mass, preferably 1 to 500 parts by mass, more preferably 2 to 100 parts by mass, relative to 100 parts by mass of the water hardly-soluble organic solvent.

The procedure is followed by washing by neutral water. Usable as such neutral water is so-called deionized water or ultrapure water. The amount of such water is to be 0.01 to 100 L, preferably 0.05 to 50 L, and more preferably 0.1 to 5 L, relative to 1 L of the silicon-containing compound solution. The washing procedure may be conducted by introducing both liquids into one vessel, stirring them, and then leaving them to stand still, followed by separation of a water layer. It is enough for the number of washing steps to be one or more, preferably one to about five, because commensurate effects are not obtained even by washing of ten or more times.

Other examples of methods for removing the acid catalyst include a method based on an ion-exchange resin, and a method for conducting neutralization by epoxy compounds such as ethylene oxide and propylene oxide followed by removal. These methods can be appropriately selected in conformity to the acid catalyst for the reaction.

Since a part of the silicon-containing compound is sometimes migrated into a water layer by the washing operation at this time to provide an effect substantially equivalent to a fractionation, the number of washing times and the amount of washing water may be appropriately selected in view of the catalyst removal effect and fractionation effect.

In both cases of a silicon-containing compound including the acid catalyst left therein and a silicon-containing compound solution from which the acid catalyst has been removed, a final solvent is added thereto, and solvent exchange is conducted under reduced pressure, to obtain a resultant silicon-containing compound solution. Although the temperature for solvent exchange depends on the types of reaction solvent, extraction solvent and the like to be removed, the temperature is preferably 0 to 100° C., more preferably 10 to 90° C., and even more preferably 15 to 80° C. Further, although the reduced pressure varies depending on the type of extraction solvent to be removed, types of evacuating apparatus and condensation apparatus, and the heating temperature, the reduced pressure is preferably at the atmospheric pressure or lower, more preferably 80 kPa or lower in absolute pressure, and even more preferably 50 kPa or lower in absolute pressure.

In this process, there is a case that exchange of the solvent causes destabilization of the silicon-containing compound. This destabilization is caused by incompatibility of the silicon-containing compound with the final solvent; and to prohibit this, a monovalent, or a divalent or higher alcohol having a cyclic ether substituent described in paragraphs (0181) to (0182) of Japanese Patent Laid-Open (kokai) No. 2009-126940 may be added as a stabilizer. Adding amount thereof is 0 to 25 parts by mass, preferably 0 to 15 parts by mass, or still more preferably 0 to 5 parts by mass, relative to 100 parts by mass of the silicon-containing compound in the solution before the solvent exchange; in the case that this is added, the amount thereof is preferably 0.5 or more parts by mass. If necessary, solvent exchange may be carried out after a monovalent, or a divalent or higher alcohol having a cyclic ether substituent is added into the solution before the solvent exchange.

There is a fear that the silicon-containing compound goes on the condensation reaction when it is concentrated above a certain concentration level whereby the compound is changed to the state not redissolvable into an organic solvent; and thus, it is desirable to maintain the state of solution having a proper concentration. If the concentration thereof is too dilute, amount of the solvent becomes excessively large; and thus, the state of solution having a proper concentration is desirable in view of economy. Concentration at this time is preferably 0.1 to 20% by mass.

Suitable as a final solvent to be added to the silicon-containing compound solution is an alcohol-based solvent, and particularly desirable examples thereof include monoalkyl ether derivatives of: ethylene glycol, diethylene glycol, triethylene glycol, propylene glycol, dipropylene glycol, and butanediol. Preferable examples concretely include butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether.

Alternatively, in the case that the alcohol-based solvents are main components, a non-alcoholic solvent may be added as a supplemental solvent. Examples of this supplemental solvents include acetone, tetrahydrofurane, toluene, hexane, ethyl acetate, cyclohexanone, methylamyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, methyl isobutyl ketone, and cyclopentyl methyl ether.

As another operation for reaction by using an acid catalyst, water or water-containing organic solvent is added to the monomers or an organic solution of monomers, to initiate a hydrolysis reaction. At this time, the catalyst may be added to the monomers or the organic solution of monomers, or may have been added into water or the water-containing organic solvent. The reaction temperature is to be 0 to 100° C., preferably 10 to 80° C. It is a preferable procedure to conduct heating to 10 to 50° C. upon dropping of water, and to subsequently raise the temperature to 20 to 80° C. for maturation.

In case of using organic solvents, water-soluble ones are preferable, and examples thereof include methanol, ethanol, 1-propanol, 2-propanol, 1-butanol, 2-butanol, 2-methyl-1-propanol, acetone, tetrahydrofuran, acetonitrile; polyvalent alcohol condensate derivatives such as: butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; and mixtures thereof.

Amount of the organic solvent to be used is preferably in the range of 0 to 1,000 mL, or in particular 0 to 500 mL, relative to one mole of the monomer. Smaller amount of the organic solvent is more economical because a reactor volume becomes smaller. Work-up of the reaction mixture obtained is done, in a manner similar to that of the previously mentioned, to obtain the intended silicon-containing compound.

Synthesis Method 2: Base Catalyst

The silicon-containing compound can be produced by a hydrolysis-condensation reaction of monomers in the presence of a base catalyst. Illustrative examples of the base catalyst to be used in the reaction include methylamine, ethylamine, propylamine, butylamine, ethylene diamine, hexamethylene diamine, dimethylamine, diethylamine, ethylmethylamine, trimethylamine, triethylamine, tripropylamine, tributylamine, cyclohexylamine, dicyclohexylamine, monoethanolamine, diethanolamine, dimethyl monoethanolamine, monomethyl diethanolamine, triethanolamine, diazabicyclooctane, diazabicyclononene, diazabicycloundecene, hexamethylene tetramine, aniline, N,N-dimethylaniline, pyridine, N,N-dimethylaminopyridine, pyrrole, piperazine, pyrrolidine, piperidine, picoline, tetramethylammonium hydroxide, corrin hydroxide, tetrapropylammonium hydroxide, tetrabutylammonium hydroxide, ammonia, lithium hydroxide, sodium hydroxide, potassium hydroxide, barium hydroxide, and calcium hydroxide. Amount of the catalyst to be used is $1 \times 10^{-6}$ to 10 mole, preferably $1 \times 10^{-5}$ to 5 mole, or more preferably $1 \times 10^{-4}$ to 1 mole, relative to one mole of the silicon monomer.

The amount of water upon obtainment of the silicon-containing compound from these monomers by hydrolytic condensation, is preferably 0.1 to 50 moles per mole of hydrolyzable substitutional groups bonded to the monomers. Addition amounts 50 moles or less are economical, due to small-sized apparatuses to be used for reactions.

As a manipulation manner, the monomers are added into an aqueous catalyst solution, to cause initiation of a hydrolytic condensation reaction. At this time, the organic solvent may be added into the aqueous catalyst solution, or monomers may have been diluted with the organic solvent, or both procedures may be performed. The reaction temperature is to be 0 to 100° C., preferably 5 to 80° C. It is a preferable manner to keep the temperature at 5 to 80° C. upon dropping of the monomers, and subsequently mature them at 20 to 80° C.

As to the organic solvent that can be added to the aqueous base catalyst solution or can dilute the monomers, the same organic solvents as those illustrated as the example that can be added to the aqueous acid catalyst solution may be used preferably. Meanwhile, in view of carrying out the reaction economically, amount of the organic solvent to be used is preferably 0 to 1000 mL relative to one mole of the monomer.

Thereafter, neutralization reaction of the catalyst is conducted if necessary, thereby obtaining an aqueous solution of reaction mixture. At this time, the amount of an acidic substance usable for neutralization is preferably 0.1 to 2 equivalents relative to the basic material used as the catalyst. This acidic substance is arbitrary, insofar as the same exhibits acidity in water.

Subsequently, it is preferable to remove, from the reaction mixture, a by-product such as an alcohol formed by the hydrolysis condensation reaction by such a method as distillation under reduced pressure. In this removal procedure, a temperature to heat the reaction mixture is preferably 0 to 100° C., more preferably 10 to 90° C., or still more preferably 15 to 80° C., though depending on the organic solvent added, the alcohol formed by the reaction, and the like. The degree of evacuation during the removal procedure is preferably below an atmospheric pressure, more preferably 80 or less kPa by absolute pressure, or still more preferably 50 or less kPa by absolute pressure, though different depending on an exhausting equipment, a condensation equipment, a heating temperature, and an organic solvent, an alcohol, and the like to be removed. During this procedure, it is preferable that about 80% or more by mass of the total alcohol and the like formed is removed, though it is difficult to know exactly the amount of removed alcohol.

Then, in order to remove the base catalyst used in the hydrolysis-condensation reaction, the silicon-containing compound is extracted by an organic solvent. As to the organic solvent to be used for this operation, a solvent that can dissolve the silicon-containing compound and can be separated into two layers when mixed with water is desirable. Alternatively, a mixture of a water-soluble organic solvent and a water-insoluble organic solvent may also be used.

Specific examples of the organic solvent to be used for removal of the base catalyst include those organic solvents mentioned before as the specific examples in removal of the acid catalyst and those similar to the mixture of a water-soluble organic solvent and a water-insoluble organic solvent.

Note that although the mixing ratio of the water-soluble organic solvent and the water hardly-soluble organic solvent is to be appropriately selected, the water-soluble organic solvent is selected to be 0.1 to 1,000 parts by mass, preferably 1 to 500 parts by mass, more preferably 2 to 100 parts by mass, relative to 100 parts by mass of the water hardly-soluble organic solvent.

The procedure is followed by washing by neutral water. Usable as such neutral water is so-called deionized water or ultrapure water. The amount of such water is to be 0.01 to 100 L, preferably 0.05 to 50 L, and more preferably 0.1 to 5 L, relative to 1 L of the silicon-containing compound solution. The washing procedure may be conducted by introducing both liquids into one vessel, stirring them, and then leaving them to stand still, followed by separation of a water layer. It is enough for the number of washing steps to be one or more, preferably one to about five, because commensurate effects are not obtained even by washing of ten or more times.

A final solvent is added to the silicon-containing compound solution from which the acid catalyst has been removed, and solvent exchange is conducted under reduced pressure, to obtain a resultant silicon-containing compound solution. Although the temperature for solvent exchange depends on the types of extraction solvent and the like to be removed, the temperature is preferably 0 to 100° C., more preferably 10 to 90° C., and even more preferably 15 to 80° C. Further, although the reduced pressure varies depending on the type of extraction solvent to be removed, types of evacuating apparatus and condensation apparatus, and the heating temperature, the reduced pressure is preferably at the atmospheric pressure or lower, more preferably 80 kPa or lower in absolute pressure, and even more preferably 50 kPa or lower in absolute pressure.

Suitable as a final solvent to be added to the silicon-containing compound solution is an alcohol-based solvent, and particularly desirable examples thereof include monoalkyl ether derivatives of: ethylene glycol, diethylene glycol, triethylene glycol, propylene glycol, and dipropylene glycol. Preferable examples concretely include propylene glycol monomethyl ether, ethylene glycol monomethyl ether, propylene glycol monoethyl ether, ethylene glycol monoethyl ether, propylene glycol monopropyl ether, and ethylene glycol monopropyl ether.

As another operation for reaction by using a base catalyst, water or water-containing organic solvent is added to the monomers or an organic solution of monomers, to initiate a hydrolysis reaction. At this time, the catalyst may be added to the monomers or the organic solution of monomers, or may have been added into water or the water-containing organic solvent. The reaction temperature is to be 0 to 100° C., preferably 10 to 80° C. It is a preferable procedure to conduct heating to 10 to 50° C. upon dropping of water, and to subsequently raise the temperature to 20 to 80° C. for maturation.

The organic solvents, which can be used as organic solution of monomers or which can be used as the water-containing organic solvent, are preferably water-soluble one. Examples thereof include methanol, ethanol, 1-propanol, 2-propanol, 1-butanol, 2-butanol, 2-methyl-1-propanol, acetone, tetrahydrofuran, acetonitrile; and polyvalent alcohol condensate derivatives such as: propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; and mixtures thereof.

Although the molecular weight of the silicon-containing compound obtained by the synthesis method 1 or 2 can be adjusted not only by selection of monomers but also by control of reaction condition upon polymerization, adoption of compounds having weight-average molecular weights exceeding 100,000 occasionally cause occurrence of extraneous substances or coating patch, so that those compounds are to be preferably used which have weight-average molecular weights of 100,000 or less, preferably 200 to 50,000, and more preferably 300 to 30,000, respectively. Note that the data concerning the weight-average molecular weight is obtained as a molecular weight determined by gel permeation chromatography (GPC) using an RI detector, polystyrene as standard substance and tetrahydrofuran as elution solvent.

Other Components:

Thermal Crosslinking Accelerator

In the present invention, a thermal crosslinking accelerator may be blended to the composition for forming a silicon-containing resist underlayer film. As to the blendable thermal crosslinking accelerator, compounds shown by the following general formula (5) or (6) may be mentioned. Specifically, the materials described in Japanese Patent Laid-Open (kokai) No. 2007-302873 may be mentioned,

$$L_a H_b X \quad (5)$$

wherein, L represents lithium, sodium, potassium, rubidium, or cesium; X represents a hydroxyl group, or a monovalent, or a divalent or higher organic acid group having 1 to 30 carbon atoms; "a" represents an integer of 1 or more, "b" represents 0 or an integer of 1 or more, and a+b represents a valency of the hydroxyl group or the organic acid group,

$$MY \quad (6)$$

wherein, M represents sulfonium, iodonium, or ammonium; and Y represents a non-nucleophilic counter ion.

Note that the thermal crosslinking accelerators can be used solely in one kind or combinedly in two or more kinds. The addition amount of the thermal crosslinking accelerators is preferably 0.01 to 50 parts by mass, and more preferably 0.1 to 40 parts by mass, relative to 100 parts by mass of the base polymer (i.e., the silicon-containing compounds of the component (A) and (B) obtained by the above procedure).

(Organic Acid)

To improve stability of the silicon-containing resist under layer film-forming composition to be used for the present invention, it is preferably to add a monovalent, divalent, or higher organic acid having 1 to 30 carbon atoms. Examples of the acid to be added include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, and citric acid. Particularly preferable examples include oxalic acid, maleic acid, formic acid, acetic acid, propionic acid, and citric acid. It is possible to mixingly use two or more kinds of acids, so as to keep the stability. The addition amount is 0.001 to 25 parts by mass, preferably 0.01 to 15 parts by mass, and more preferably 0.1 to 5 parts by mass, relative to 100 parts by mass of the silicon contained in the composition.

Alternatively, the organic acid is preferably blended in a manner to achieve $0 \leq pH \leq 7$, more preferably $0.3 \leq pH \leq 6.5$, and even more preferably $0.5 \leq pH \leq 6$, when evaluated as a pH of the composition.

(Water)

In the present invention, into the composition may be added water. When water is added thereinto, the silicon-containing compound is hydrated, so that a lithography performance may be improved. Amount of water in the solvent component of the composition is in the range of more than 0% by mass to less than 50% by mass, more preferably 0.3 to 30% by mass, or still more preferably 0.5 to 20% by mass. If amount of each component is too large, uniformity of a silicon-containing resist underlayer film becomes poor, whereby eye holes occur if the worst happens. On the other hand, if the amount thereof is too small, a lithography performance is deteriorated; and thus it is not desirable.

Amount of totality of the solvent including water is preferably 100 to 100,000 parts by mass, or in particular 200 to 50,000 parts by mass, relative to 100 parts by mass of the base polymer of the component (A) and (B).

(Photoacid Generator)

Into the composition of the present invention, a photoacid generator may be added. Concrete examples of photoacid generators to be used for the present invention include a material described in paragraphs (0160) to (0179) of Japanese Patent Laid-Open (kokai) No. 2009-126940.

(Stabilizer)

Further, into the composition of the present invention, a stabilizer may be added. As a stabilizer, a monovalent or divalent or higher alcohol having a cyclic ether as a substitutional group may be added thereinto. In particular, when the material(s) described in paragraphs (0180) to (0184) of Japanese Patent Laid-Open (kokai) No. 2009-126940 is added, so that the composition for forming a silicon-containing resist underlayer film can be improved in stability.

(Surfactant)

Furthermore, in the present invention, it is possible to blend the composition with a surfactant, as required. Concrete examples of such a surfactant include materials described in paragraph (0185) of Japanese Patent Laid-Open (kokai) No. 2009-126940.

[Negative-Patterning Process]

(Negative-Patterning Process 1)

The present invention provides a patterning process, wherein an organic underlayer film is formed on a body to be processed by using an application-type composition for the organic underlayer film, on this organic underlayer film is formed a silicon-containing resist underlayer film by using the composition for forming the silicon-containing resist underlayer film, on this silicon-containing resist underlayer film is formed a photoresist film by using a chemically amplified resist composition, the photoresist film is exposed to a high energy beam after heat treatment, a negative pattern is formed by dissolving an unexposed area of the photoresist film by using an organic solvent developer, pattern transfer is made onto the silicon-containing resist underlayer film by dry-etching by using the photoresist film having the negative pattern as a mask, pattern transfer is made onto the organic underlayer film by dry-etching by using the silicon-containing resist underlayer film having the transferred pattern as a mask, and then pattern transfer is made onto the body to be processed by dry-etching by using the organic underlayer film having the transferred pattern as a mask (what is called "multilayer resist method").

(Negative-Patterning Process 2)

In addition, the present invention provides a patterning process, wherein an organic hard mask mainly comprising carbon is formed on a body to be processed by a CVD method, on this organic hard mask is formed a silicon-containing resist underlayer film by using the composition for forming the silicon-containing resist underlayer film, on this silicon-containing resist underlayer film is formed a photoresist film by using a chemically amplified resist composition, the photoresist film is exposed to a high energy beam after heat treatment, a negative pattern is formed by dissolving an unexposed area of the photoresist film by using an organic solvent developer, pattern transfer is made onto the silicon-containing resist underlayer film by dry-etching by using the photoresist film having the negative pattern as a mask, pattern transfer is made onto the organic hard mask by dry-etching by using the silicon-containing resist underlayer film having the transferred pattern as a mask, and then pattern transfer is made onto the body to be processed by dry-etching by using the organic hard mask having the transferred pattern as a mask (what is called "multilayer resist method").

When a negative pattern is formed by using the composition of the present invention for a resist underlayer film, by optimizing combination with the CVD film or the organic underlayer film in the way as mentioned above, a pattern formed with a photoresist can be formed on a substrate without causing size difference.

Further, in photo-exposure of the photoresist film, the contact angle of a part of the silicon-containing resist underlayer film corresponding to an exposed area of the exposed photoresist film is decreased by 10 degrees or more after photo-exposure as compared with before photo-exposure.

When the contact angle of the of the part of the silicon-containing resist underlayer film corresponding to the exposed area of the exposed photoresist film is decreased by 10 degrees or more as compared with before the photo-exposure, difference of the contact angle with that of the resist pattern after the negative development becomes smaller thereby enhancing adhesion properties and thus prohibiting pattern fall; and as a result, a fine pattern may be formed.

The silicon-containing resist underlayer film used in the patterning process of the present invention can be formed on a body to be processed by spin coating and so on of the composition for forming the silicon-containing resist underlayer film of the present invention, similarly to the method used for the photoresist film. After spin coating, it is preferable that the solvent is evaporated, and then, in order to avoid mixing with the photoresist film, baking is carried out so as to accelerate a crosslinking reaction. Baking temperature is preferably in the range of 50 to 500° C., and with the time thereof being preferably in the range of 10 to 300 seconds. Especially preferable temperature range thereof is 400° C. or lower to reduce thermal damage to a device, though depending on structure of the device to be produced.

Usable as the body to be processed is a substrate for a semiconductor device, or the substrate for a semiconductor device coated with a metal film, metal carbide film, metal oxide film, metal nitride film, or metal oxide nitride film, as a layer to be processed (process-targeted portion).

Although a silicon substrate is typically used as the substrate for a semiconductor device, without limited thereto, it is possible to use a substrate made of a material such as Si, amorphous silicon (a-Si), p-Si, $SiO_2$, SiN, SiON, W, TiN, Al, or the like, which can be different from that of the layer to be processed.

Usable as a metal constituting the body to be processed is silicon, titanium, tungsten, hafnium, zirconium, chromium, germanium, copper, aluminum, iron, or an alloy thereof, and usable as the layer to be processed containing such a metal is Si, $SiO_2$, SiN, SiON, SiOC, p-Si, α-Si, TiN, WSi, BPSG, SOG, Cr, CrO, CrON, MoSi, W, W—Si, Al, Cu, Al—Si, or the like, or various low dielectric films, or an etching stopper film therefor, for example, which can each be formed to typically have a thickness of 50 to 10,000 nm, and particularly 100 to 5,000 nm.

In the negative-patterning process of the present invention, the photoresist film is of a chemical amplification type, and is not particularly restricted as far as it can form a negative pattern by development using an organic solvent developer.

For example, if the exposure step of the present invention is carried out by an exposure process using an ArF excimer laser beam, any resist composition used for a usual ArF excimer laser beam may be used as for the photoresist film.

Already known as such a resist composition for ArF excimer laser are numerous candidates including known resins, which are generally classified into poly(meth)acryl resins, COMA (Cyclo Olefin Maleic Anhydride) resins, COMA-(meth)acryl hybrid resins, ROMP (Ring Opening Methathesis Polymerization) resins, polynorbornene resins, and the like; and resist compositions using poly(meth)acryl resins among them are superior to other type resins in terms of resolution performance because the poly(meth)acryl resins each have an alicyclic structure introduced in its side-chain to thereby ensure an etching resistance.

In the negative-patterning process, after the silicon-containing resist underlayer film is formed, the photoresist film is formed thereon by using a photoresist composition solution by using preferably a spin coating method, similarly to the case of the silicon-containing resist underlayer film. After the photoresist composition is applied by a spin coating method, pre-baking is carried out, preferably at 80 to 180° C. and for 10 to 300 seconds. Then, this is followed by exposure, and then, the organic solvent development to obtain a negative resist pattern. In addition, it is preferable that post-exposure baking (PEE) is carried out after the exposure.

As the developer of the organic solvent, it is possible to use the developer containing, as a component(s), one or more kinds selected from among: 2-octanone, 2-nonanone, 2-heptanone, 3-heptanone, 4-heptanone, 2-hexanone, 3-hexanone, diisobutylketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxy-isobutyrate, ethyl 2-hydroxy-isobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and acetic acid 2-phenylethyl, it is preferable to use the developer containing one kind, or two or more kinds of the aforementioned developer components, in a total amount of 50% or more by mass, from standpoints of improving pattern collapse, for example.

In the patterning process of the present invention, when the silicon-containing resist underlayer film is etched, the etching is carried out by using a gas mainly comprising a fluorine-containing gas such as a freon gas. In order to reduce film loss of the photoresist film, it is preferable that the silicon-containing film have a high etching speed to the foregoing gas.

In the multi-layer resist method as mentioned above, in the case that an organic underlayer film is formed between the silicon-containing resist underlayer film and the body to be processed whereby this organic underlayer film is used as an etching mask for the body to be processed, the organic underlayer film is preferably an organic film having an aromatic skeleton; however, in the case that the organic underlayer film is a sacrificial film or the like, a silicon-containing organic underlayer film may be used provided that the silicon amount contained therein is 15% or less by mass.

As to the material for an organic underlayer film like this, usable are materials such as those heretofore known as the composition for the resist underlayer film in a bilayer resist method or a three-layer resist method including heretofore known compositions for the underlayer film in a three-layer resist method or in a bilayer resist method using a silicon resist composition, and also many resins including a novolak resin such as 4,4'-(9-fluorenylidene)bisphenol novolak resin (molecular weight of 11,000) described in Japanese Patent Laid-Open (kokai) No. 2005-128509. In the case that a higher heat resistance than a usual novolak is wanted, a polycyclic skeleton may be introduced such as for example in the case of 6,6'-(9-fluorenylidene)-di(2-naphthol) novolak resin, or in addition, a polyimide resin may be selected (for example, Japanese Patent Laid-Open (kokai) No. 2004-153125).

The organic underlayer film can be formed on the body to be processed by using a composition solution in the same manner as the photoresist composition, such as by spin coating. After forming the organic underlayer film by spin coating or the like, it is desirable to bake it to evaporate an organic solvent therefrom. Baking is to be preferably conducted within a temperature range of BO to 300° C. and within a time range of 10 to 300 seconds.

Note that the thickness of the organic underlayer film is 5 nm or more, particularly preferably 20 nm or more to 50,000 nm or less without particularly limited thereto though the thickness varies depending on the etching condition; the thickness of the silicon-containing resist underlayer film of the present invention is to be 1 nm or more to 500 nm or less, preferably to be 300 nm or less, more preferably to be 200 nm or less; and the thickness of a photoresist film is preferably between 1 nm or more and 200 nm or less.

[Patterning Process of the Present Invention According to the Three-Layer Resist Method]

The negative-patterning process of the present invention according to the three-layer resist method as mentioned above is done as following (refer to FIG. 1). In this process, firstly the organic underlayer film 2 is formed on the body to be processed 1 by a spin coating method (FIG. 1 (I-A)). It is desired that the organic under layer film 2 have high etching resistance because this acts as a mask during etching of the body to be processed 1; and it is also desired that this undergo crosslinking by heat or an acid after forming by spin coating because mixing with the silicon-containing film of the upper layer is undesirable.

Then, onto it the silicon-containing resist under layer film 3 is formed by a spin coating method by using the composition of the present invention for a silicon-containing resist underlayer film (FIG. 1 (I-B)), and then the photoresist film 4 is formed thereonto by a spin coating method (FIG. 1 (I-C)). Meanwhile, the silicon-containing resist underlayer film 3 can be formed by using a composition giving the silicon-containing resist underlayer film 3 whose pure-water contact angle in the part corresponding to the exposed area of the photoresist film 4 is in the range of 40 degrees or more to lower than 70 degrees after exposure.

The photoresist film 4 is subjected to a usual pattern exposure, by using the mask 5, using a light source P corresponding to the photoresist film 4, such as, for example, a KrF excimer laser beam, an ArF excimer laser beam, an $F_2$ laser beam, and an EUV beam, to form a pattern preferably by any of a photolithography with the wavelength ranging from 10 nm or more to 300 nm or less, a direct drawing by an electron beam, and a nanoimprinting, or a combination of them (FIG. 1 (I-D)); and thereafter, heat treatment thereof under the condition matching with each photoresist film (FIG. 1 (I-E)), development by the organic solvent development (negative development), and then, as appropriate, rinsing are performed to obtain the negative resist pattern 4a (FIG. 1 (I-F)).

Then, by using this negative resist pattern 4a as an etching mask, etching is carried out under the dry etching condition that the etching speed of the silicon-containing resist underlayer film 3 is significantly faster relative to the photoresist film, for example, by dry etching using a fluorine-based gas plasma. As a result, the silicon-containing resist underlayer film pattern of negative type 3a can be obtained without substantially receiving an effect of pattern change due to side etching of the resist film (FIG. 1 (I-G)).

Then, the organic underlayer film 2 is dry-etched under the dry etching condition that the etching speed of the organic resist underlayer film is significantly faster relative to the substrate having the silicon-containing resist underlayer film pattern of negative type 3a having the transferred negative resist pattern 4a obtained above, for example, by a reactive dry etching with a gas plasma containing oxygen or by a reactive dry etching with a gas plasma containing hydrogen and nitrogen. In this etching process, the organic underlayer film pattern of negative type 2a is obtained, while at the same time, the uppermost photoresist film is usually lost (FIG. 1 (I-H)). Then, by using the organic underlayer film pattern of negative type 2a thereby obtained as an etching mask, the body to be processed 1 can be dry-etched with high precision by using, for example, a fluorine-based dry etching or a chlorine-based dry etching to transfer the negative pattern 1a to the body to be processed 1 (FIG. 1 (I-I)).

Meanwhile, in the process of the three-layer resist method mentioned above, an organic hard mask formed by a CVD method may also be used instead of the organic underlayer film 2. In this case also, the body to be processed can be processed by the procedure similar to the above procedure.

[Positive-Patterning Process]
(Positive-Patterning Process 1)

In addition, the present invention provides a patterning process, wherein an organic underlayer film is formed on a body to be processed by using an application-type composition for the organic underlayer film, on this organic underlayer film is formed a silicon-containing resist underlayer film by using the composition for forming the silicon-containing resist underlayer film, on this silicon-containing resist underlayer film is formed a photoresist film by using a chemically amplified resist composition, the photoresist film is exposed to a high energy beam after heat treatment, a positive pattern is formed by dissolving an exposed area of the photoresist film by using an alkaline developer, pattern transfer is made onto the silicon-containing resist underlayer film by dry-etching by using the photoresist film having the positive pattern as a mask, pattern transfer is made onto the organic underlayer film by dry-etching by using the silicon-containing resist underlayer film having the transferred pattern as a mask, and then pattern transfer is made onto the body to be processed by dry-etching by using the organic underlayer film having the transferred pattern as a mask.

(Positive-Patterning Process 2)

Further, a patterning process, wherein an organic hard mask mainly comprising carbon is formed on a body to be processed by a CVD method, on this organic hard mask is formed a silicon-containing resist underlayer film by using the composition for forming the silicon-containing resist underlayer film, on this silicon-containing resist underlayer film is formed a photoresist film by using a chemically amplified resist composition, the photoresist film is exposed to a high energy beam after heat treatment, a positive pattern is formed by dissolving an exposed area of the photoresist film by using an alkaline developer, pattern transfer is made onto the silicon-containing resist underlayer film by dry-etching by using the photoresist film having the positive pattern as a mask, pattern transfer is made onto the organic hard mask by dry-etching by using the silicon-containing resist underlayer film having the transferred pattern as a mask, and then pattern transfer is made onto the body to be processed by dry-etching by using the organic hard mask having the transferred pattern as a mask.

When patterning is done by a positive development using the composition of the present invention for forming a resist underlayer film, by optimizing combination with the CVD film or the organic underlayer film in the way as mentioned above, a pattern formed with a photoresist can be formed on a substrate without causing size difference.

In photo-exposure of the photoresist film, it is preferable that change of the contact angle in a part of the silicon-containing resist underlayer film corresponding to an unexposed area of the exposed photoresist film is 10 degree or less as compared with before photo-exposure. If difference of the contact angles between an unexposed area of the photoresist film and a part of the silicon-containing resist underlayer film corresponding to this area is 10 degrees or less, good adhesion can be realized in the positive development; and as a result, a fine pattern can be formed.

In the positive patterning process of the present invention, the photoresist film is not particularly restricted provided that the film is of a chemically amplifying type and a positive pattern can be formed by development using an alkaline developer. As to other items including method for film formation, body to be processed, organic underlayer film, and organic hard mask may be the same as those explained in the negative patterning process.

In the positive patterning process, after formation of the photoresist film and heat treatment, photo-exposure is done, and then an alkaline development is done by using an alkaline developer to obtain a positive resist pattern. In addition, it is preferable to carry out post-exposure bake (PEB) after the photo-exposure.

As the alkaline developer, tetramethylammonium hydroxide (TMAH) etc. can be used.

[Patterning Process of the Present Invention According to the Three-Layer Resist Method]

The positive-patterning process of the present invention according to the three-layer resist method as mentioned above is done as following (refer to FIG. 1).

In this process, firstly the organic underlayer film 2 is formed on the body to be processed 1 by a spin coating method (FIG. 1 (II-A)). It is desired that the organic underlayer film 2 has high etching resistance because this acts as a mask during etching of the body to be processed 1; and it is also desired that this undergoes crosslinking by heat or an acid after forming by spin coating because mixing with the silicon-containing resist underlayer film of the upper layer is undesirable.

Then, onto it the silicon-containing resist underlayer film 3 is formed by a spin coating method by using the composition of the present invention for forming a silicon-containing resist underlayer film (FIG. 1 (II-B)), and then the photoresist film 4 is formed thereonto by a spin coating method (FIG. 1 (II-C)). Meanwhile, the silicon-containing resist underlayer film 3 can be formed by using a composition giving the silicon-containing resist underlayer film 3 whose pure-water contact angle in the part corresponding to the exposed area of the photoresist film 4 is in the range of 40 degrees or more to lower than 70 degrees after exposure.

The photoresist film 4 is subjected to a usual pattern exposure using a light source P corresponding to the photoresist film 4, such as, for example, a KrF excimer laser beam, an ArF excimer laser beam, an F$_2$ laser beam, and an EUV beam, to form a pattern preferably by any of a photolithography with the wavelength ranging from 10 nm or more to 300 nm or less, a direct drawing by an electron beam, and a nanoimprinting, or a combination of them (FIG. 1 (II-D)); and thereafter, heat treatment thereof under the condition matching with each photoresist film (FIG. 1 (II-E)), development by the alkaline developer, and then, as appropriate, rinsing are performed to obtain the positive resist pattern 4b (FIG. 1 (II-F)).

Then, by using this negative resist pattern 4b as an etching mask, etching is carried out under the dry etching condition that the etching speed of the silicon-containing resist underlayer film 3 is significantly faster relative to the photoresist film, for example, by dry etching using a fluorine-based gas plasma. As a result, the silicon-containing resist underlayer film pattern of positive type 3b can be obtained without substantially receiving an effect of pattern change due to side etching of the resist film (FIG. 1 (II-G)).

Then, the organic underlayer film 2 is dry-etched under the dry etching condition that the etching speed of the organic resist underlayer film 2 is significantly faster relative to the substrate having the silicon-containing resist underlayer film pattern 3b having the transferred positive resist pattern obtained above, for example, by a reactive dry etching with a gas plasma containing oxygen or by a reactive dry etching with a gas plasma containing hydrogen and nitrogen. In this etching process, the organic under layer film pattern of positive type 2b is obtained, while at the same time, the uppermost photoresist film is usually lost (FIG. 1 (II-H)). Then, by using the organic underlayer film pattern of positive type 2b thereby obtained as an etching mask, the body to be processed 1 can be dry-etched with high precision by using, for example, a fluorine-based dry etching or a chlorine-based dry etching to transfer the positive pattern 1b to the body to be processed 1 (FIG. 1 (II-I)).

Meanwhile, in the process of the three-layer resist method mentioned above, an organic hard mask formed by a CVD method may also be used instead of the organic underlayer film 2. In this case also, the body to be processed 1 can be processed by the procedure similar to the above procedure.

EXAMPLES

Although Synthesis examples, Examples, and Comparative examples will be shown and the present invention will be explained in detail hereafter, the present invention is not restricted to the following Examples. Note that the symbol "%" in the Examples represents a mass %, and the molecular weight measurement was based on GPC.

Synthesis of the Component (A)

Synthesis Example A-1

Into a mixture of 120 g of methanol, 1 g of methansulfonic acid, and 60 g of deionized water was added a mixture of 33.8 g of 4-t-butoxyphenyl trimethoxy silane (Monomer-120), 17.0 g of methyl trimethoxy silane (Monomer-101), and 47.0 g of triisopropyl borate (Monomer-110); and then, the hydrolysis-condensation reaction was carried out at 40° C. for 12 hours. After the reaction, 100 g of propylene glycol ethyl ether (PGEE) was added into it, and then, by-produced alcohols were removed by distillation under reduced pressure. Into it were added 1000 mL of ethyl acetate and 300 g of PGEE to separate an aqueous layer. Into an organic layer remained was added 100 mL of ion-exchange water; and then, the resulting mixture was agitated, settled, and separated into the layers. This procedure was repeated for three times. The organic layer remained was concentrated under reduced pressure to obtain 300 g of PGEE solution of the silicon-containing compound A-1 (polymer concentration of 15%). By an ion chromatography analysis of the obtained solution, a methanesulfonate ion was not detected. The polystyrene-equivalent molecular weight (Mw) of this compound was 3,700.

By using the monomers shown in Table 1, Synthesis Examples A-2 to A-20 and Synthesis Examples A-24 to A-25 were carried out under the conditions similar to those of Synthesis Example A-1 to obtain respective intended products. Meanwhile, in Synthesis Examples A-24 and A-25, a constituting unit derived from the general formula (2) is not contained; and thus, they are not the component (A) of the composition of the present invention.

Synthesis Example A-21

Into a mixture of 240 g of ethanol, 6 g of 25% tetramethylammonium hydroxide, and 120 g of deionized water was added a mixture of 67.6 g of 4-t-butoxyphenyl trimethoxy silane (Monomer-120), 17.0 g of methyl trimethoxy silane (Monomer-101), 5.0 g of phenyl trimethoxy silane (Monomer-100), and 18.8 g of triisopropyl borate (Monomer-110); and then, the hydrolysis-condensation reaction was carried out at 40° C. for 4 hours. After the reaction, 10 g of acetic acid was added into it for neutralization, and then, by-produced alcohols were removed by distillation under reduced pressure. Into it were added 1000 mL of ethyl acetate and 300 g of PGEE to separate an aqueous layer. Into an organic layer remained was added 100 mL of ion-exchange water; and then, the resulting mixture was agitated, settled, and separated into the layers. This procedure was repeated for three times. The organic layer remained was concentrated under reduced pressure to obtain 300 g of PGEE solution of the silicon-containing compound A-21 (polymer concentration of 15%). The polystyrene-equivalent molecular weight (Mw) of this compound was 9,700.

By using the monomers shown in Table 1, Synthesis Examples A-22 to A-23 were carried out under the conditions similar to those of Synthesis Example A-21 to obtain respective intended products.

TABLE 1

| Synthesis Example | Raw material for reaction | Mw |
|---|---|---|
| A-1 | Monomer-101: 17.0 g, Monomer-110: 47.0 g, Monomer-120: 33.8 g | 3700 |
| A-2 | Monomer-101: 17.0 g, Monomer-111: 85.1 g, Monomer-120: 33.8 g | 3100 |
| A-3 | Monomer-101: 17.0 g, Monomer-112: 91.3 g, Monomer-120: 33.8 g | 2300 |
| A-4 | Monomer-101: 17.0 g, Monomer-113: 71.0 g, Monomer-121: 35.6 g | 2500 |
| A-5 | Monomer-101: 17.0 g, Monomer-114: 81.1 g, Monomer-121: 35.6 g | 2100 |
| A-6 | Monomer-100: 5.0 g, Monomer-101: 6.8 g, Monomer-102: 22.8 g, Monomer-110: 18.8 g, Monomer-122: 57.1 g | 3000 |
| A-7 | Monomer-100: 5.0 g, Monomer-101: 6.8 g, Monomer-102: 22.8 g, Monomer-111: 34.0 g, Monomer-122: 57.1 g | 2400 |
| A-8 | Monomer-100: 5.0 g, Monomer-101: 6.8 g, Monomer-102: 22.8 g, Monomer-112: 36.5 g, Monomer-122: 57.1 g | 2300 |

TABLE 1-continued

| Synthesis Example | Raw material for reaction | Mw |
|---|---|---|
| A-9 | Monomer-100: 5.0 g, Monomer-101: 6.8 g, Monomer-103: 31.3 g, Monomer-113: 28.4 g, Monomer-123: 55.4 g | 2900 |
| A-10 | Monomer-100: 5.0 g, Monomer-101: 6.8 g, Monomer-102: 22.8 g, Monomer-114: 32.4 g, Monomer-123: 55.4 g | 3700 |
| A-11 | Monomer-101: 13.6 g, Monomer-110: 28.2 g, Monomer-124: 74.6 g | 3300 |
| A-12 | Monomer-101: 13.6 g, Monomer-111: 51.1 g, Monomer-124: 74.6 g | 2200 |
| A-13 | Monomer-101: 13.6 g, Monomer-112: 54.8 g, Monomer-124: 74.6 g | 3200 |
| A-14 | Monomer-100: 29.7 g, Monomer-101: 6.8 g, Monomer-113: 14.2 g, Monomer-127: 82.6 g | 3700 |
| A-15 | Monomer-100: 29.7 g, Monomer-101: 6.8 g, Monomer-114: 16.2 g, Monomer-127: 82.6 g | 3500 |
| A-16 | Monomer-101: 23.8 g, Monomer-110: 37.6 g, Monomer-126: 44.6 g | 2500 |
| A-17 | Monomer-101: 23.8 g, Monomer-111: 68.1 g, Monomer-127: 44.6 g | 2800 |
| A-18 | Monomer-101: 23.8 g, Monomer-114: 73.0 g, Monomer-127: 44.6 g | 3600 |
| A-19 | Monomer-101: 23.8 g, Monomer-110: 37.6 g, Monomer-128: 39.1 g | 2800 |
| A-20 | Monomer-101: 23.8 g, Monomer-110: 37.6 g, Monomer-129: 33.8 g | 3500 |
| A-21 | Monomer-100: 5.0 g, Monomer-101: 17.0 g, Monomer-110: 18.8 g, Monomer-120: 67.6 g | 9700 |
| A-22 | Monomer-101: 20.4 g, Monomer-113: 14.2 g, Monomer-125: 95.5 g | 7200 |
| A-23 | Monomer-101: 20.4 g, Monomer-114: 16.2 g, Monomer-125: 95.5 g | 9600 |
| A-24 | Monomer-101: 17.0 g, Monomer-102: 38.1 g, Monomer-120: 33.8 g | 3700 |
| A-25 | Monomer-101: 34.1 g, Monomer-105: 82.6 g | 3600 |

PhSi(OCH$_3$)$_3$ [Monomer-100] CH$_3$Si(OCH$_3$)$_3$ [Monomer-101] Si(OCH$_3$)$_4$ [Monomer-102] Si(OC$_2$H$_5$)$_4$ [Monomer-103]

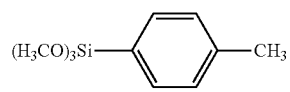

[Monomer-104]

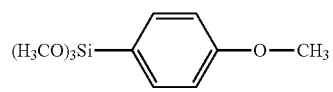

[Monomer-105]

B(OC$_3$H$_7$)$_3$ [Monomer-110] Ti(OC$_4$H$_9$)$_4$ [Monomer-111] Ge(OC$_4$H$_9$)$_4$ [Monomer-112] P$_2$O$_5$ [Monomer-113] Al[CH$_3$COCH=C(O—)CH$_3$]$_3$ [Monomer-114]

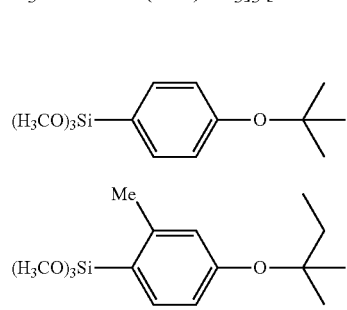

[Monomer-120]

[Monomer-121]

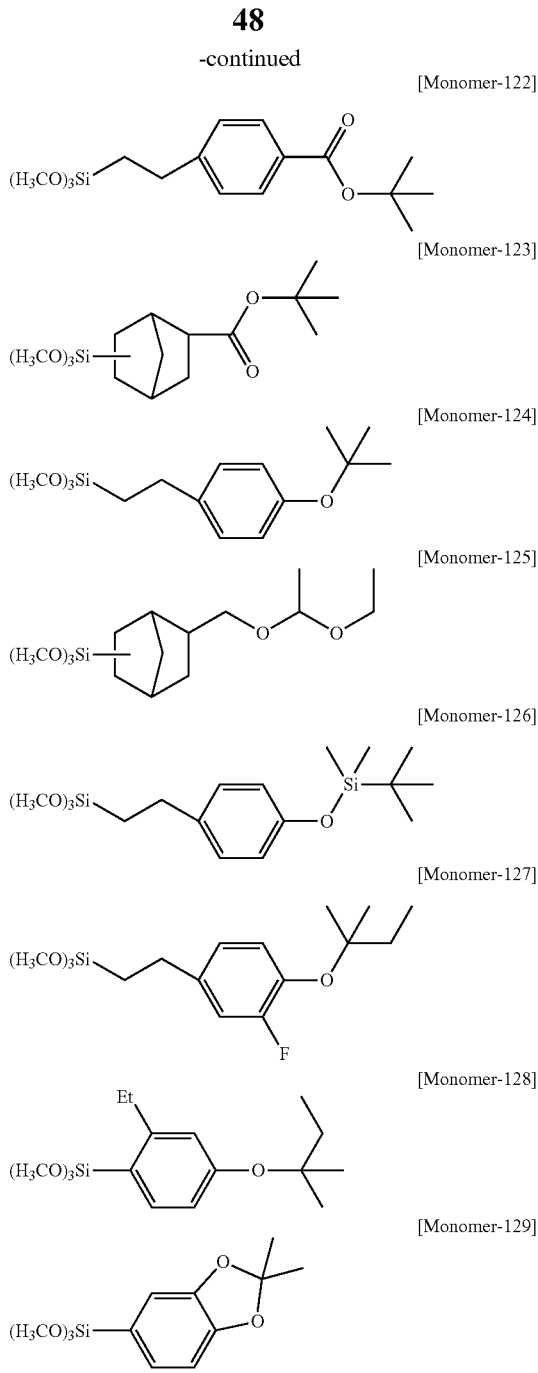

Synthesis of the Component (B)

Synthesis Example B-1

Into a mixture of 120 g of methanol, 1 g of 70% nitric acid, and 60 g of deionized water was added a mixture of 5.0 g of phenyl trimethoxy silane (Monomer-100), 3.4 g of methyl trimethoxy silane (Monomer-101), and 68.5 g of tetramethoxy silane (Monomer-102); and then, the hydrolysis-condensation reaction was carried out at 40° C. for 12 hours. After the reaction, 300 g of PGEE was added into it, and then, by-produced alcohols and excess water were removed by distillation under reduced pressure to obtain 300 g of PGEE solution of the silicon-containing compound B-1 (polymer concentration of 10%). By an ion chromatography analysis of the obtained solution, a nitrate ion was not detected. The polystyrene-equivalent molecular weight (Mw) of this compound was 2,400.

By using the monomers shown in Table 2, Synthesis Examples B-2 to B-8 were carried out under the conditions similar to those of Synthesis Example B-1 to obtain respective intended products. Meanwhile, as to B-4 and B-8, amount of the constituting unit derived from the general formula (4) is 40% by mole in the component (B).

TABLE 2

| Synthesis Example | Raw material for reaction | Mw |
|---|---|---|
| B-1 | Monomer-100: 5.0 g, Monomer-101: 3.4 g, Monomer-102: 68.5 g | 2400 |
| B-2 | Monomer-105: 5.7 g, Monomer-101: 10.2 g, Monomer-102: 60.9 g | 2800 |
| B-3 | Monomer-100: 5.0 g, Monomer-101: 30.6 g, Monomer-102: 38.1 g | 1700 |
| B-4 | Monomer-100: 5.0 g, Monomer-101: 37.5 g, Monomer-102: 30.4 g | 2300 |
| B-5 | Monomer-100: 5.0 g, Monomer-101: 3.4 g, Monomer-103: 94.0 g | 1900 |
| B-6 | Monomer-104: 5.3 g, Monomer-101: 10.2 g, Monomer-103: 83.5 g | 3300 |
| B-7 | Monomer-100: 5.0 g, Monomer-101: 30.6 g, Monomer-103: 52.2 g | 2600 |

TABLE 2-continued

| Synthesis Example | Raw material for reaction | Mw |
|---|---|---|
| B-8 | Monomer-100: 5.0 g, Monomer-101: 37.5 g, Monomer-103: 41.8 g | 3000 |

Examples and Comparative Examples

Each of the silicon-containing compounds (A-1) to (A-25) obtained in the foregoing synthesis examples as the component (A), each of the silicon-containing compounds (B-1) to (B-8) obtained in the foregoing synthesis examples as the component (B), a thermal crosslinking accelerator, a photoacid generator, an acid, a solvent, and water were mixed with the respective ratios shown in Table 3; and then, the resulting mixture was filtrated through a 0.1-μm filter made of a fluorinated resin to obtain respective composition solutions Sol.1 to Sol.44 for forming a silicon-containing resist underlayer film. Meanwhile, Sol.1 to Sol.42 are used for Examples of the present invention, and Sol.43 and Sol.44, not containing the component (A) of the present invention, are used for Comparative Examples. Further, Film-43 and Film-44 prepared from Sol.43 and Sol.44 are shown in Comparative Examples.

TABLE 3

| No. | Silicon-containing compound: Component A (parts by mass) | Silicon-containing compound: Component B (parts by mass) | Thermal crosslinking accelerator (parts by mass) | Photoacid generator (parts by mass) | Acid (parts by mass) | Solvent (parts by mass) | Water (parts by mass) |
|---|---|---|---|---|---|---|---|
| Sol. 1 | A-1(0.1) | B-1(3.9) | TPSOH (0.04) | — | maleic acid (0.04) | PGEE (150) | water (15) |
| Sol. 2 | A-1(0.1) | B-1(3.9) | TPSHCO$_3$ (0.04) | — | oxalic acid (0.04) | PGEE (150) | water (15) |
| Sol. 3 | A-1(0.1) | B-1(3.9) | TPSOx (0.04) | — | maleic acid (0.04) | PGEE (150) | water (15) |
| Sol. 4 | A-1(0.1) | B-1(3.9) | TPSTFA (0.04) | — | maleic acid (0.04) | PGEE (150) | water (15) |
| Sol. 5 | A-1(0.1) | B-1(3.9) | TPSOCOPh (0.04) | — | oxalic acid (0.04) | PGEE (150) | water (15) |
| Sol. 6 | A-1(0.1) | B-1(3.9) | TPSH$_2$PO$_4$ (0.04) | — | oxalic acid (0.04) | PGEE (150) | water (15) |
| Sol. 7 | A-1(0.1) | B-1(3.9) | QMAMA (0.04) | — | maleic acid (0.04) | PGEE (150) | water (15) |
| Sol. 8 | A-1(0.1) | B-1(3.9) | QBANO$_3$ (0.04) | — | maleic acid (0.04) | PGEE (150) | water (15) |
| Sol. 9 | A-1(0.1) | B-1(3.9) | QMATFA (0.04) | TPSNf (0.04) | maleic acid (0.04) | PGEE (150) | water (15) |
| Sol. 10 | A-1(0.1) | B-1(3.9) | Ph$_2$ICl (0.04) | — | maleic acid (0.04) | PGEE (150) | water (15) |
| Sol. 11 | A-1(0.1) | B-1(3.9) | TPSMA (0.04) | — | maleic acid (0.04) | PGEE (150) | water (15) |
| Sol. 12 | A-2(0.1) | B-1(3.9) | TPSMA (0.04) | — | oxalic acid (0.04) | PGEE (150) | water (15) |

TABLE 3-continued

| No. | Silicon-containing compound: Component A (parts by mass) | Silicon-containing compound: Component B (parts by mass) | Thermal crosslinking accelerator (parts by mass) | Photoacid generator (parts by mass) | Acid (parts by mass) | Solvent (parts by mass) | Water (parts by mass) |
|---|---|---|---|---|---|---|---|
| Sol. 13 | A-3(0.1) | B-1(3.9) | TPSMA (0.04) | — | maleic acid (0.04) | PGEE (150) | water (15) |
| Sol. 14 | A-4(0.1) | B-1(3.9) | TPSMA (0.04) | — | maleic acid (0.04) | PGEE (150) | water (15) |
| Sol. 15 | A-5(0.1) | B-1(3.9) | TPSMA (0.04) | — | oxalic acid (0.04) | PGEE (150) | water (15) |
| Sol. 16 | A-6(0.1) | B-1(3.9) | TPSMA (0.04) | — | oxalic acid (0.04) | PGEE (150) | water (15) |
| Sol. 17 | A-7(0.1) | B-1(3.9) | TPSMA (0.04) | — | maleic acid (0.04) | PGEE (150) | water (15) |
| Sol. 18 | A-8(0.1) | B-1(3.9) | TPSMA (0.04) | — | maleic acid (0.04) | PGEE (150) | water (15) |
| Sol. 19 | A-9(0.1) | B-1(3.9) | TPSMA (0.04) | — | maleic acid (0.04) | PGEE (150) | water (15) |
| Sol. 20 | A-10(0.1) | B-1(3.9) | TPSMA (0.04) | TPSNf (0.04) | maleic acid (0.04) | PGEE (150) | water (15) |
| Sol. 21 | A-11(0.1) | B-1(3.9) | TPSMA (0.04) | — | maleic acid (0.04) | PGEE (150) | water (15) |
| Sol. 22 | A-12(0.1) | B-1(3.9) | TPSMA (0.04) | — | maleic acid (0.04) | PGEE (150) | water (15) |
| Sol. 23 | A-13(0.1) | B-1(3.9) | TPSMA (0.04) | — | maleic acid (0.04) | PGEE (150) | water (15) |
| Sol. 24 | A-14(0.1) | B-1(3.9) | TPSMA (0.04) | — | maleic acid (0.04) | PGEE (150) | water (15) |
| Sol. 25 | A-15(0.1) | B-1(3.9) | TPSMA (0.04) | — | maleic acid (0.04) | PGEE (150) | water (15) |
| Sol. 26 | A-16(0.1) | B-1(3.9) | TPSMA (0.04) | — | maleic acid (0.04) | PGEE (150) | water (15) |
| Sol. 27 | A-17(0.1) | B-1(3.9) | TPSMA (0.04) | — | maleic acid (0.04) | PGEE (150) | water (15) |
| Sol. 28 | A-18(0.1) | B-1(3.9) | TPSMA (0.04) | — | maleic acid (0.04) | PGEE (150) | water (15) |
| Sol. 29 | A-19(0.1) | B-1(3.9) | TPSMA (0.04) | — | maleic acid (0.04) | PGEE (150) | water (15) |
| Sol. 30 | A-20(0.1) | B-1(3.9) | TPSMA (0.04) | TPSNf (0.04) | maleic acid (0.04) | PGEE (150) | water (15) |
| Sol. 31 | A-21(0.1) | B-1(3.9) | TPSMA (0.04) | — | maleic acid (0.04) | PGEE (150) | water (15) |
| Sol. 32 | A-22(0.1) | B-1(3.9) | TPSMA (0.04) | — | maleic acid (0.04) | PGEE (150) | water (15) |
| Sol. 33 | A-23(0.1) | B-1(3.9) | TPSMA (0.04) | — | maleic acid (0.04) | PGEE (150) | water (15) |
| Sol. 34 | A-1(0.1) | B-2(3.9) | TPSMA (0.04) | — | maleic acid (0.04) | PGEE (150) | water (15) |
| Sol. 35 | A-1(0.1) | B-3(3.9) | TPSMA (0.04) | — | maleic acid (0.04) | PGEE (150) | water (15) |
| Sol. 36 | A-1(0.1) | B-5(3.9) | TPSMA (0.04) | — | maleic acid (0.04) | PGEE (150) | water (15) |

TABLE 3-continued

| No. | Silicon-containing compound: Component A (parts by mass) | Silicon-containing compound: Component B (parts by mass) | Thermal crosslinking accelerator (parts by mass) | Photoacid generator (parts by mass) | Acid (parts by mass) | Solvent (parts by mass) | Water (parts by mass) |
|---|---|---|---|---|---|---|---|
| Sol. 37 | A-1(0.1) | B-6(3.9) | TPSMA (0.04) | — | maleic acid (0.04) | PGEE (150) | water (15) |
| Sol. 38 | A-1(0.1) | B-7(3.9) | TPSMA (0.04) | — | maleic acid (0.04) | PGEE (150) | water (15) |
| Sol. 39 | A-1(1.5) | B-1(2.5) | TPSMA (0.04) | — | maleic acid (0.04) | PGEE (150) | water (15) |
| Sol. 40 | A-1(2.0) | B-1(2.0) | TPSMA (0.04) | — | maleic acid (0.04) | PGEE (150) | water (15) |
| Sol. 41 | A-1(0.1) | B-4(3.9) | TPSMA (0.04) | — | maleic acid (0.04) | PGEE (150) | water (15) |
| Sol. 42 | A-1(0.1) | B-8(3.9) | TPSMA (0.04) | — | maleic acid (0.04) | PGEE (150) | water (15) |
| Sol. 43 | A-24(0.1) | B-1(3.9) | TPSMA (0.04) | — | maleic acid (0.04) | PGEE (150) | water (15) |
| Sol. 44 | A-25(0.1) | B-1(3.9) | TPSMA (0.04) | — | maleic acid (0.04) | PGEE (150) | water (15) |

TPSOH: triphenylsulfonium hydroxide
TPSHCO$_3$: mono-(triphenylsulfonium) carbonate
TPSOx: mono-(triphenylsulfonium) oxalate
TPSTFA: triphenylsulfonium trifluoroacetate
TPSOCOPh: triphenylsulfonium benzoate
TPSH$_2$PO$_4$: mono-(triphenylsulfonium) phosphate
TPSMA: mono-(triphenylsulfonium) maleate
TPSNf: triphenylsulfonium nonafluorobutan sulfonate
QMAMA: mono-(tetramethyl ammonium) maleate
QMATFA: tetramethyl ammonium trifluoroacetate
QBANO$_3$: tetrabuthyl ammonium nitrate
Ph$_2$ICl: diphenyl iodonium chloride Measurement of Contact Angles:
Contact Angle of the Silicon-Containing Resist Underlayer Film (CA1)

Each of the composition solutions Sol.1 to Sol.44 for forming a resist underlayer film was applied on a substrate and then heated at 240° C. for 60 seconds to obtain respective silicon-containing resist underlayer films Film-1 to Film-44 having film thickness of 35 nm; and then, the contact angle thereof to pure water (CA1) was measured (Table 4).

Contact Angle of the Silicon-Containing Resist Underlayer Film after Photoresist Coating for the Positive Development and Removal of it (CA2)

Each of the composition solutions Sol.1 to Sol.44 for forming a silicon-containing resist underlayer film was applied onto a silicon wafer and then heated at 240° C. for 60 seconds to obtain respective silicon-containing resist underlayer films Film-1 to Film-44 having film thickness of 35 nm. Onto it was applied the ArF resist solution shown in Table 9 (PR-1), and then baked at 100° C. for 60 seconds to form a photoresist film having film thickness of 100 nm. Then, entirety of the photoresist film was removed by rinsing with propylene glycol monomethyl ether (PGME) to obtain a film that is equivalent to the silicon-containing resist underlayer film corresponding to an unexposed area of the unexposed photoresist film. Contact angles of these films to pure water (CA2) were measured (Table 5).

Contact Angle of the Silicon-Containing Resist Underlayer Film after Photoresist Coating for the Negative Development and Removal of it (CA3)

Each of the composition solutions Sol.1 to Sol.44 for forming a silicon-containing resist underlayer film was applied onto a silicon wafer and then heated at 240° C. for 60 seconds to obtain respective silicon-containing resist underlayer films Film-1 to Film-44 having film thickness of 35 nm. Onto it was applied the ArF resist solution for the negative development shown in Table 12 (PR-3), and then baked at 100° C. for 60 seconds to form a photoresist film having film thickness of 100 nm. Further, the photoresist film was applied with the immersion top coat shown in Table 10 (TC-1), and baked at 90° C. for 60 seconds to form a top coat having film thickness of 50 nm. Then, entirety of the immersion top coat and the photoresist film were removed by rinsing with propylene glycol monomethyl ether (PGME) to obtain a film that is equivalent the silicon-containing resist underlayer film corresponding to an unexposed area of the unexposed photoresist film. Contact angles of these films to pure water (CA3) were measured (Table 6).

Contact Angle of the Silicon-Containing Resist Underlayer Film after Photoresist Coating for the Negative Development, Photo-Exposure, and Removal of it (CA4)

Each of the composition solutions Sol.1 to Sol.44 for forming a silicon-containing resist underlayer film was applied onto a silicon wafer and then heated at 240° C. for 60 seconds to obtain respective silicon-containing underlayer films Film-1 to Film-44 having film thickness of 35 nm. Onto it was applied the ArF resist solution for the negative development shown in Table 12 (PR-3), and then baked at 100° C. for 60 seconds to form a photoresist film having film thickness of 100 nm. Further, the photoresist film was applied with the immersion top coat shown in Table 10 (TC-1), and then baked at 90° C. for 60 seconds to form a top coat having film thickness of 50 nm. Then, entirety of it was exposed by using an ArF immersion exposure instrument (NSR-S610C, manufactured by Nikon Corp.), baked at 100° C. for 60 seconds (PEB), poured with a butyl acetate developer for 3 seconds from a developer nozzle while rotating at 30 rpm, developed by a puddle development method for 27 seconds without rotation, spin-dried after rinsing with diisoamyl ether, and then baked at 100° C. for 20 seconds to remove the rinsing solvent by evaporation. Entirety of the remained photoresist film was removed by rinsing with PGME to obtain a film that is equivalent the silicon-containing resist underlayer film corresponding to an exposed area of the exposed photoresist film. Contact angles of these films to pure water (CA4) were measured (Table 7).

Contact Angles of the Photoresist Film for the Negative Development Before and after Photo-Exposure Each ArF resist solution for the negative development shown in Table 12 (PR-3 and PR-4) was applied and then baked at 100° C. for 60 seconds to prepare the photoresist film having film thickness of 100 nm; and then, contact angle thereof to pure water was measured. Then, entirety of this resist film was exposed by using an ArF exposure instrument (NSR-S610C, manufactured by Nikon Corp.), baked at 100° C. for 60 seconds (PEB), spin-dried after rinsing with diisoamyl ether, and then baked at 100° C. for 20 seconds to remove the rinsing solvent by evaporation to obtain the ArF resist film corresponding to the patterned area not having the acid-labile group at the time of negative development. Contact angle thereof to pure water was measured (Table 8).

TABLE 4

| No. | Contact angle |
| --- | --- |
| Film 1 | 73° |
| Film 2 | 71° |
| Film 3 | 74° |
| Film 4 | 72° |
| Film 5 | 71° |
| Film 6 | 73° |
| Film 7 | 70° |
| Film 8 | 74° |
| Film 9 | 72° |
| Film 10 | 70° |
| Film 11 | 70° |
| Film 12 | 73° |
| Film 13 | 71° |
| Film 14 | 71° |
| Film 15 | 69° |
| Film 16 | 71° |
| Film 17 | 73° |
| Film 18 | 70° |
| Film 19 | 73° |
| Film 20 | 71° |
| Film 21 | 73° |
| Film 22 | 71° |
| Film 23 | 72° |
| Film 24 | 72° |
| Film 25 | 73° |
| Film 26 | 69° |
| Film 27 | 76° |
| Film 28 | 77° |
| Film 29 | 71° |
| Film 30 | 70° |
| Film 31 | 70° |
| Film 32 | 72° |
| Film 33 | 74° |
| Film 34 | 71° |
| Film 35 | 73° |
| Film 36 | 73° |
| Film 37 | 74° |
| Film 38 | 69° |
| Film 39 | 72° |
| Film 40 | 73° |
| Film 41 | 71° |
| Film 42 | 75° |
| Film 43 | 70° |
| Film 44 | 77° |

TABLE 5

| No. | Contact angle |
| --- | --- |
| Film 1 | 65° |
| Film 2 | 63° |
| Film 3 | 65° |
| Film 4 | 66° |
| Film 5 | 64° |
| Film 6 | 64° |
| Film 7 | 64° |
| Film 8 | 64° |
| Film 9 | 65° |
| Film 10 | 66° |
| Film 11 | 64° |
| Film 12 | 66° |
| Film 13 | 65° |
| Film 14 | 65° |
| Film 15 | 65° |
| Film 16 | 65° |
| Film 17 | 64° |
| Film 18 | 64° |
| Film 19 | 65° |
| Film 20 | 65° |
| Film 21 | 64° |
| Film 22 | 66° |
| Film 23 | 64° |
| Film 24 | 65° |
| Film 25 | 64° |
| Film 26 | 61° |
| Film 27 | 67° |
| Film 28 | 69° |
| Film 29 | 63° |
| Film 30 | 65° |
| Film 31 | 64° |
| Film 32 | 66° |
| Film 33 | 67° |
| Film 34 | 65° |
| Film 35 | 66° |
| Film 36 | 64° |
| Film 37 | 64° |
| Film 38 | 64° |
| Film 39 | 64° |
| Film 40 | 65° |
| Film 41 | 63° |
| Film 42 | 68° |
| Film 43 | 61° |
| Film 44 | 64° |

TABLE 6

| No. | Contact angle |
|---|---|
| Film 1 | 64° |
| Film 2 | 63° |
| Film 3 | 65° |
| Film 4 | 64° |
| Film 5 | 64° |
| Film 6 | 64° |
| Film 7 | 63° |
| Film 8 | 64° |
| Film 9 | 65° |
| Film 10 | 66° |
| Film 11 | 64° |
| Film 12 | 63° |
| Film 13 | 65° |
| Film 14 | 65° |
| Film 15 | 64° |
| Film 16 | 65° |
| Film 17 | 65° |
| Film 18 | 64° |
| Film 19 | 65° |
| Film 20 | 65° |
| Film 21 | 64° |
| Film 22 | 63° |
| Film 23 | 64° |
| Film 24 | 66° |
| Film 25 | 64° |
| Film 26 | 63° |
| Film 27 | 68° |
| Film 28 | 69° |
| Film 29 | 64° |
| Film 30 | 65° |
| Film 31 | 63° |
| Film 32 | 66° |
| Film 33 | 64° |
| Film 34 | 65° |
| Film 35 | 63° |
| Film 36 | 64° |
| Film 37 | 64° |
| Film 38 | 63° |
| Film 39 | 64° |
| Film 40 | 64° |
| Film 41 | 64° |
| Film 42 | 68° |
| Film 43 | 62° |
| Film 44 | 64° |

TABLE 7

| No. | Contact angle |
|---|---|
| Film 1 | 45° |
| Film 2 | 48° |
| Film 3 | 49° |
| Film 4 | 48° |
| Film 5 | 48° |
| Film 6 | 48° |
| Film 7 | 52° |
| Film 8 | 46° |
| Film 9 | 47° |
| Film 10 | 47° |
| Film 11 | 52° |
| Film 12 | 48° |
| Film 13 | 48° |
| Film 14 | 45° |
| Film 15 | 46° |
| Film 16 | 50° |
| Film 17 | 49° |
| Film 18 | 45° |
| Film 19 | 49° |
| Film 20 | 50° |
| Film 21 | 47° |
| Film 22 | 47° |
| Film 23 | 47° |
| Film 24 | 47° |
| Film 25 | 45° |
| Film 26 | 46° |
| Film 27 | 52° |
| Film 28 | 50° |
| Film 29 | 48° |
| Film 30 | 53° |
| Film 31 | 53° |
| Film 32 | 50° |
| Film 33 | 46° |
| Film 34 | 48° |
| Film 35 | 49° |
| Film 36 | 48° |
| Film 37 | 49° |
| Film 38 | 47° |
| Film 39 | 49° |
| Film 40 | 46° |
| Film 41 | 49° |
| Film 42 | 47° |
| Film 43 | 49° |
| Film 44 | 62° |

TABLE 8

| No. | Contact angle | No. | Contact angle |
|---|---|---|---|
| unexposed PR-3 | 71° | exposed PR-3 | 53° |
| unexposed PR-4 | 73° | exposed PR-4 | 56° |

Patterning Test by the Positive Development

Onto a silicon wafer was formed a spin-on carbon film ODL-50 (carbon content of 80% by mass, manufactured by Shin-Etsu Chemical Co., Ltd.) having film thickness of 200 nm. Onto this was applied each of the composition solutions Sol.11 to Sol.44 for forming a resist underlayer film, and then baked at 240° C. for 60 seconds to obtain the respective silicon-containing resist underlayer films Film-11 to Film-44 having film thickness of 35 nm.

Thereafter, onto this silicon-containing resist underlayer film was applied the ArF resist solution for the positive development shown in Table 9 (PR-1), and then baked at 110° C. for 60 seconds to obtain the photoresist film having film thickness of 100 nm. Further, the photoresist film was applied with the immersion top coat shown in Table 10 (TC-1), and then baked at 90° C. for 60 seconds to obtain the top coat having film thickness of 50 nm (Examples 1-1 to 1-32 and Comparative Examples 1-1 to 1-2).

Then, this was exposed by using an ArF immersion exposure instrument (NSR-S610C, manufactured by Nikon Corp., NA 1.30, σ 0.98/0.65, 35 degree dipolar polarized illumination, 6% half tone phase shift mask), baked at 100° C. for 60 seconds (PEB), and then developed by an aqueous tetramethylammonium hydroxide (TMAH) solution (concentration of 2.38% by mass) for 30 seconds to obtain the 43-nm 1:1 positive line-and-space pattern.

As to this size, pattern fall was measured with an electron microscope (CG 4000, manufactured by Hitachi High-technologies Corp.) and pattern profile of cross section was measured with an electron microscope (S-9380, manufactured by Hitachi, Ltd.) (Table 11).

TABLE 9

| No. | Polymer (parts by mass) | Acid generator (parts by mass) | Base (parts by mass) | Water-shedding polymer (parts by mass) | Solvent (parts by mass) |
|---|---|---|---|---|---|
| PR-1 | ArF resist polymer 1 (100) | PAG1 (7.0) | Quencher (1.0) | — | PGMEA (2,500) |
| PR-2 | ArF resist polymer 1 (100) | PAG1 (10.0) | Quencher (2.0) | Water-shedding polymer 1 (4.0) | PGMEA (2,500) |

ArF Resist Polymer 1:
  Molecular weight (Mw)=7,800
  Distribution (Mw/Mn)=1.78

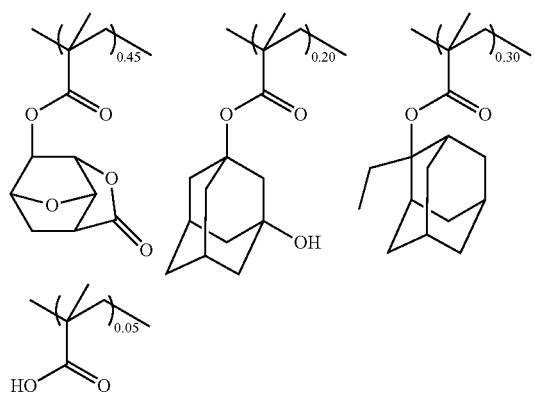

Acid Generator: PAG 1

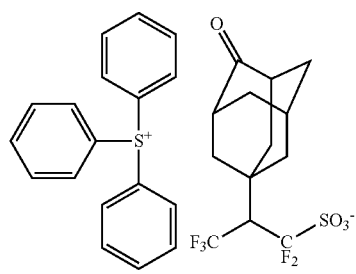

Base: Quencher

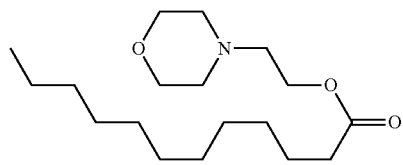 [SMILES: CCCCCCCCCCCC(=O)OCCN1CCOCC1]

Water-Shedding Polymer 1:
  Molecular weight (Mw)=8,200
  Distribution (Mw/Mn)=1.67

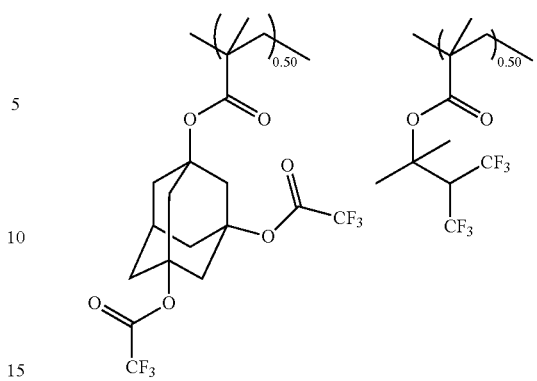

Top-Coat Polymer:
  Molecular weight (Mw)=8,800
  Distribution (Mw/Mn)=1.69

TABLE 10

| | Polymer (parts by mass) | Organic solvent (parts by mass) |
|---|---|---|
| TC-1 | Top-coat polymer (100) | diisoamylether (2700) 2-methyl-1-butanol (270) |

TABLE 11

| Examples | Silicon-containing resist underlayer film | ArF resist | Pattern profile of cross section after development | Pattern collapse | CA1-CA2 |
|---|---|---|---|---|---|
| Example 1-1 | Film11 | PR-1 | vertical profile | free | 4° |
| Example 1-2 | Film12 | PR-1 | vertical profile | free | 7° |
| Example 1-3 | Film13 | PR-1 | vertical profile | free | 6° |
| Example 1-4 | Film14 | PR-1 | vertical profile | free | 6° |
| Example 1-5 | Film15 | PR-1 | vertical profile | free | 4° |
| Example 1-6 | Film16 | PR-1 | vertical profile | free | 6° |
| Example 1-7 | Film17 | PR-1 | vertical profile | free | 9° |
| Example 1-8 | Film18 | PR-1 | vertical profile | free | 6° |
| Example 1-9 | Film19 | PR-1 | vertical profile | free | 8° |
| Example 1-10 | Film20 | PR-1 | vertical profile | free | 6° |
| Example 1-11 | Film21 | PR-1 | vertical profile | free | 9° |

TABLE 11-continued

| Examples | Silicon-containing resist underlayer film | ArF resist | Pattern profile of cross section after development | Pattern collapse | CA1-CA2 |
|---|---|---|---|---|---|
| Example 1-12 | Film22 | PR-1 | vertical profile | free | 5° |
| Example 1-13 | Film23 | PR-1 | vertical profile | free | 8° |
| Example 1-14 | Film24 | PR-1 | vertical profile | free | 7° |
| Example 1-15 | Film25 | PR-1 | vertical profile | free | 9° |
| Example 1-16 | Film26 | PR-1 | vertical profile | free | 8° |
| Example 1-17 | Film27 | PR-1 | vertical profile | free | 9° |
| Example 1-18 | Film28 | PR-1 | vertical profile | free | 8° |
| Example 1-19 | Film29 | PR-1 | vertical profile | free | 8° |
| Example 1-20 | Film30 | PR-1 | vertical profile | free | 5° |
| Example 1-21 | Film31 | PR-1 | vertical profile | free | 6° |
| Example 1-22 | Film32 | PR-1 | vertical profile | free | 6° |
| Example 1-23 | Film33 | PR-1 | vertical profile | free | 7° |
| Example 1-24 | Film34 | PR-1 | vertical profile | free | 6° |
| Example 1-25 | Film35 | PR-1 | vertical profile | free | 7° |
| Example 1-26 | Film36 | PR-1 | vertical profile | free | 9° |
| Example 1-27 | Film37 | PR-1 | vertical profile | free | 10° |
| Example 1-28 | Film38 | PR-1 | vertical profile | free | 5° |
| Example 1-29 | Film39 | PR-1 | vertical profile | free | 8° |
| Example 1-30 | Film40 | PR-1 | vertical profile | free | 8° |
| Example 1-31 | Film41 | PR-1 | vertical profile | free | 8° |
| Example 1-32 | Film42 | PR-1 | vertical profile | free | 7° |
| Comparative Example 1-1 | Film43 | PR-1 | vertical profile | free | 8° |
| Comparative Example 1-2 | Film44 | PR-1 | vertical profile | free | 7° |

As shown in Table 11, when the silicon-containing resist underlayer film having the change amount of 10 degrees or less between the contact angle (CA1) of the silicon-containing resist underlayer film and the contact angle (CA2) of the silicon-containing resist underlayer film after coating with the photoresist for the positive development and removal of it was used as the resist underlayer film, a vertical profile in the resist cross section could be obtained in the positive development. It was also confirmed that there was no pattern fall.

Patterning Test by the Negative Development

Onto a silicon wafer was formed a spin-on carbon film ODL-50 (carbon content of 80% by mass, manufactured by Shin-Etsu Chemical Co., Ltd.) having film thickness of 200 nm. Onto this was applied each of the composition solutions Sol.11 to Sol.44 for forming a resist underlayer film, and then baked at 240° C. for 60 seconds to obtain the respective silicon-containing resist underlayer films Film-11 to Film-44 having film thickness of 35 nm.

Thereafter, onto this silicon-containing resist underlayer film was applied the ArF resist solution for the negative development shown in Table 12 (PR-3), and then baked at 100° C. for 60 seconds to obtain the photoresist film having film thickness of 100 nm. Further, the photoresist film was applied with the immersion top coat shown in Table 10 (TC-1), and then baked at 90° C. for 60 seconds to obtain the top coat having film thickness of 50 nm (Examples 2-1 to 2-32 and Comparative Examples 2-1 to 2-2).

Then, this was exposed by using an ArF immersion exposure instrument (NSR-S610C, manufactured by Nikon Corp., NA 1.30, σ 0.98/0.65, 35 degree dipolar polarized illumination, 6% half tone phase shift mask), baked at 100° C. for 60 seconds (PEB), poured with a butyl acetate developer for 3 seconds from a developer nozzle while rotating at 30 rpm, developed by a puddle development method for 27 seconds without rotation, spin-dried after rinsing with diisoamyl ether, and then baked at 100° C. for 20 seconds to remove the rinsing solvent by evaporation.

By this patterning, the negative 43-nm 1:1 line-and-space pattern was obtained. As to this size, pattern fall was measured with an electron microscope (CG 4000, manufactured by Hitachi High-technologies Corp.) and pattern profile of cross section was measured with an electron microscope (S-4700, manufactured by Hitachi, Ltd.) (Table 13).

TABLE 12

| No. | Polymer (parts by mass) | Acid generator (parts by mass) | Base (parts by mass) | Water-shedding polymer (parts by mass) | Solvent (parts by mass) |
|---|---|---|---|---|---|
| PR-3 | ArF resist polymer 2 (100) | PAG2 (7.0) | Quencher (1.0) | — | PGMEA (2,500) |
| PR-4 | ArF resist polymer 3 (100) | PAG2 (7.0) | Quencher (1.0) | — | PGMEA (2,500) |
| PR-5 | ArF resist polymer 3 (100) | PAG2 (10.0) | Quencher (2.0) | Water-shedding polymer 1 (4.0) | PGMEA (2,500) |

ArF Resist Polymer 2:

Molecular weight (Mw)=8,600

Distribution (Mw/Mn)=1.88

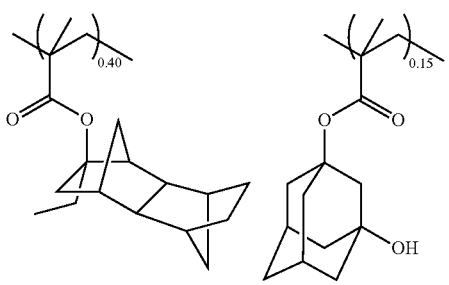

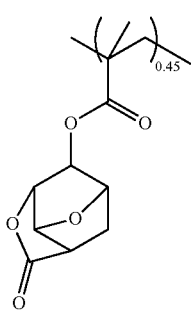

ArF Resist Polymer 3:

Molecular weight (Mw)=8,900

Distribution (Mw/Mn)=1.93

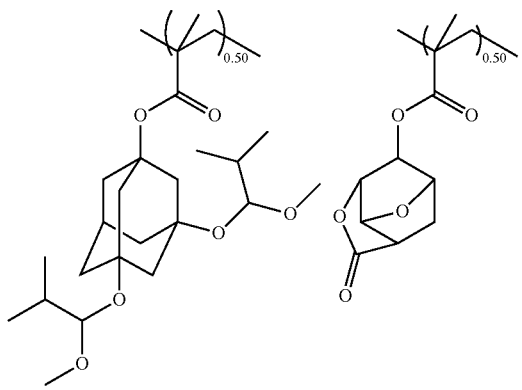

Acid Generator: PAG 2

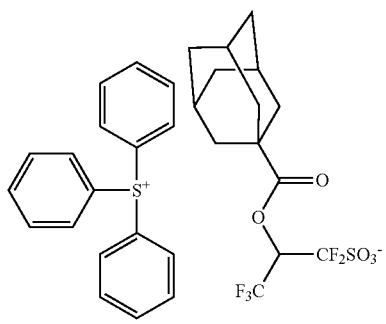

Base: Quencher

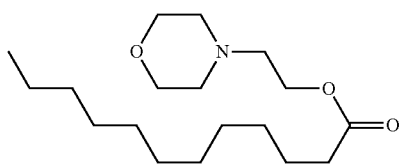 [SMILES: CCCCCCCCCCCC(=O)OCCN1CCOCC1]

TABLE 13

| Examples | Silicon-containing resist underlayer film | ArF resist | Pattern profile of cross section after development | Pattern collapse | CA3-CA4 |
|---|---|---|---|---|---|
| Example 2-1 | Film11 | PR-3 | vertical profile | free | 12° |
| Example 2-2 | Film12 | PR-3 | vertical profile | free | 15° |
| Example 2-3 | Film13 | PR-3 | vertical profile | free | 17° |
| Example 2-4 | Film14 | PR-3 | vertical profile | free | 20° |
| Example 2-5 | Film15 | PR-3 | vertical profile | free | 18° |
| Example 2-6 | Film16 | PR-3 | vertical profile | free | 15° |

TABLE 13-continued

| Examples | Silicon-containing resist underlayer film | ArF resist | Pattern profile of cross section after development | Pattern collapse | CA3-CA4 |
|---|---|---|---|---|---|
| Example 2-7 | Film17 | PR-3 | vertical profile | free | 16° |
| Example 2-8 | Film18 | PR-3 | vertical profile | free | 19° |
| Example 2-9 | Film19 | PR-3 | vertical profile | free | 16° |
| Example 2-10 | Film20 | PR-3 | vertical profile | free | 15° |
| Example 2-11 | Film21 | PR-3 | vertical profile | free | 17° |
| Example 2-12 | Film22 | PR-3 | vertical profile | free | 16° |
| Example 2-13 | Film23 | PR-3 | vertical profile | free | 17° |
| Example 2-14 | Film24 | PR-3 | vertical profile | free | 19° |
| Example 2-15 | Film25 | PR-3 | vertical profile | free | 19° |
| Example 2-16 | Film26 | PR-3 | vertical profile | free | 17° |
| Example 2-17 | Film27 | PR-3 | vertical profile | free | 16° |
| Example 2-18 | Film28 | PR-3 | vertical profile | free | 19° |
| Example 2-19 | Film29 | PR-3 | vertical profile | free | 16° |
| Example 2-20 | Film30 | PR-3 | vertical profile | free | 18° |
| Example 2-21 | Film31 | PR-3 | vertical profile | free | 10° |
| Example 2-22 | Film32 | PR-3 | vertical profile | free | 16° |
| Example 2-23 | Film33 | PR-3 | vertical profile | free | 18° |
| Example 2-24 | Film34 | PR-3 | vertical profile | free | 17° |
| Example 2-25 | Film35 | PR-3 | vertical profile | free | 16° |
| Example 2-26 | Film36 | PR-3 | vertical profile | free | 16° |
| Example 2-27 | Film37 | PR-3 | vertical profile | free | 15° |
| Example 2-28 | Film38 | PR-3 | vertical profile | free | 16° |
| Example 2-29 | Film39 | PR-3 | vertical profile | free | 15° |
| Example 2-30 | Film40 | PR-3 | vertical profile | free | 17° |
| Example 2-31 | Film41 | PR-3 | vertical profile | free | 15° |
| Example 2-32 | Film42 | PR-3 | vertical profile | free | 21° |
| Comparative Example 2-1 | Film43 | PR-3 | vertical profile | free | 13° |
| Comparative Example 2-2 | Film44 | PR-3 | vertical profile | occurrence | 2° |

As shown in Table 13, when the silicon-containing resist underlayer film having the change amount of 10 degrees or more between the contact angle (CA3) of the silicon-containing resist underlayer film after coating with the photoresist for the negative development and removal of it and the contact angle (CA4) of the silicon-containing resist underlayer film after coating with the photoresist for the negative development, exposure, and removal of it was used as the resist underlayer film, a vertical profile in the resist cross section could be obtained in the negative development. It was also confirmed that there was no pattern fall. On the other hand, in the negative development of Comparative Example 2-2 not containing an organic group substituted with an acid-labile group, the change amount of the contact angle was so small that pattern fall occurred.

Patterning Test: Developer

By following the procedures similar to those of Example 2 except that ArF resists and developers shown below were used instead of the developer (butyl acetate) used in Example 2, the negative 43-nm 1:1 line-and-space pattern of Film-11 was obtained by using the composition solution Sol.11 for forming a resist underlayer film. These results are shown in Table 14. By using these various developers, a resist pattern having a vertical profile of its cross section could be obtained (Examples 3-1 to 3-6).

TABLE 14

| | Silicon-containing resist underlayer film | ArF resist | Developer | Pattern profile of cross section after development | Pattern collapse |
|---|---|---|---|---|---|
| Example 3-1 | Film11 | PR-3 | 2-heptanone | vertical profile | free |
| Example 3-2 | Film11 | PR-3 | methyl benzoate | vertical profile | free |
| Example 3-3 | Film11 | PR-4 | ethyl benzoate | vertical profile | free |
| Example 3-4 | Film11 | PR-4 | phenyl acetate | vertical profile | free |
| Example 3-5 | Film11 | PR-5 | benzyl acetate | vertical profile | free |
| Example 3-6 | Film11 | PR-5 | methyl phenylacetate | vertical profile | free |

Pattern Etching Test: Positive Pattern

Similarly to Example 1, silicon-containing resist underlayer films Film-11 to Film-40 and Film-43 were prepared; and onto each of these silicon-containing resist underlayer films was applied the ArF resist solution for the positive development shown in Table 9 (PR-1), and then baked at 110° C. for 60 seconds to form the photoresist film having film thickness of 100 nm. Onto the photoresist film was applied the immersion top coat shown in Table 10 (TC-1), and then baked at 90° C. for 60 seconds to form the top coat having film thickness of 50 nm (Examples 4-1 to 4-10, 4-21 to 4-30, and Comparative Example 4-1).

Separately from the above, the ArF resist solution for positive development shown in Table 9 (PR-2) was applied onto the silicon-containing resist underlayer film, and then baked at 110° C. for 60 seconds to form the photoresist film having film thickness of 100 nm (Examples 4-11 to 4-20).

By using the resist pattern thus obtained by the positive development as a mask, the silicon-containing resist underlayer film was dry-etched under the following condition (1) and then dry-etched under the following condition (2) to transfer the pattern onto the spin-on carbon film. Pattern profile of cross section of the obtained pattern was measured with an electron microscope (S-9380, manufactured by Hitachi, Ltd.) and pattern roughness was measured with an electron microscope (CG 4000, manufactured by Hitachi High-technologies Corp.); and they were compared as summarized in Table 15.

(1) Etching Condition in the $CHF_3/CF_4$ Gas System
Instrument: dry etching instrument Telius SP (manufactured by Tokyo Electron Ltd.)
Etching Condition (1):

| Chamber pressure | 10 Pa |
|---|---|
| Upper/Lower RF power | 500 W/300 W |
| $CHF_3$ gas flow rate | 50 mL/minute |
| $CF_4$ gas flow rate | 150 mL/minute |
| Ar gas flow rate | 100 mL/minute |
| Treatment time | 40 seconds |

(2) Etching Condition in the $O_2/N_2$ Gas System
Instrument: dry etching instrument Telius SP (manufactured by Tokyo Electron Ltd.)
Etching Condition (2):

| Chamber pressure | 2 Pa |
|---|---|
| Upper/Lower RF power | 1000 W/300 W |
| $O_2$ gas flow rate | 300 mL/minute |
| $N_2$ gas flow rate | 100 mL/minute |
| Ar gas flow rate | 100 mL/minute |
| Treatment time | 30 seconds |

TABLE 15

| Examples | Silicon-containing resist underlayer film | ArF resist | Pattern profile of cross section of spin-on carbon film after dry etching | Pattern roughness |
|---|---|---|---|---|
| Example 4-1 | Film11 | PR-1 | vertical profile | 1.7 nm |
| Example 4-2 | Film12 | PR-1 | vertical profile | 1.5 nm |
| Example 4-3 | Film13 | PR-1 | vertical profile | 2.0 nm |
| Example 4-4 | Film14 | PR-1 | vertical profile | 1.7 nm |
| Example 4-5 | Film15 | PR-1 | vertical profile | 1.6 nm |
| Example 4-6 | Film16 | PR-1 | vertical profile | 1.9 nm |
| Example 4-7 | Film17 | PR-1 | vertical profile | 1.6 nm |
| Example 4-8 | Film18 | PR-1 | vertical profile | 2.2 nm |
| Example 4-9 | Film19 | PR-1 | vertical profile | 1.8 nm |
| Example 4-10 | Film20 | PR-1 | vertical profile | 1.7 nm |
| Example 4-11 | Film21 | PR-2 | vertical profile | 1.8 nm |
| Example 4-12 | Film22 | PR-2 | vertical profile | 1.8 nm |
| Example 4-13 | Film23 | PR-2 | vertical profile | 1.6 nm |
| Example 4-14 | Film24 | PR-2 | vertical profile | 2.1 nm |
| Example 4-15 | Film25 | PR-2 | vertical profile | 2.1 nm |
| Example 4-16 | Film26 | PR-2 | vertical profile | 1.9 nm |
| Example 4-17 | Film27 | PR-2 | vertical profile | 2.0 nm |
| Example 4-18 | Film28 | PR-2 | vertical profile | 1.6 nm |
| Example 4-19 | Film29 | PR-2 | vertical profile | 2.1 nm |
| Example 4-20 | Film30 | PR-2 | vertical profile | 1.7 nm |
| Example 4-21 | Film31 | PR-1 | vertical profile | 1.5 nm |
| Example 4-22 | Film32 | PR-1 | vertical profile | 2.1 nm |
| Example 4-23 | Film33 | PR-1 | vertical profile | 2.0 nm |
| Example 4-24 | Film34 | PR-1 | vertical profile | 2.1 nm |
| Example 4-25 | Film35 | PR-1 | vertical profile | 1.9 nm |
| Example 4-26 | Film36 | PR-1 | vertical profile | 1.9 nm |
| Example 4-27 | Film37 | PR-1 | vertical profile | 1.6 nm |
| Example 4-28 | Film38 | PR-1 | vertical profile | 2.0 nm |
| Example 4-29 | Film39 | PR-1 | vertical profile | 2.1 nm |
| Example 4-30 | Film40 | PR-1 | vertical profile | 1.9 nm |
| Comparative Example 4-1 | Film43 | PR-1 | vertical profile | 4.1 nm |

In the present invention, as can be seen in Table 15, it was found that not only resist profile after development, but also pattern profile of cross section and pattern roughness after processing of the spin-on carbon film were excellent. On the other hand, in the silicon-containing film formed of only a silicon compound as the comparative example (Comparative Example 4-1), etching resistance of the component locally present near surface is comparatively high; and thus, during the time of dry etching of the resist underlayer film by using the upperlayer resist pattern as a mask, the upperlayer resist is damaged, which is observed finally as pattern roughness after processing of the spin-on carbon film.

Pattern Etching Test: Negative Pattern

Similarly to Example 2, silicon-containing resist underlayer films Film-11 to Film-40 and Film-43 were prepared; and onto each of these silicon-containing resist underlayer films was applied the ArF resist solution for the negative development shown in Table 12 (PR-3 and PR-4), and then baked at 100° C. for 60 seconds to form the photoresist film having film thickness of 100 nm. Onto the photoresist film was applied the immersion top coat shown in Table 10 (TC-1), and then baked at 90° C. for 60 seconds to form the top coat having film thickness of 50 nm (Examples 5-1 to 5-20, 5-29 to 5-30, and Comparative Example 5-1).

Separately from the above, the ArF resist solution for the negative development shown in Table 12 (PR-5) was applied onto the silicon-containing resist underlayer film, and then baked at 110° C. for 60 seconds to form the photoresist film having film thickness of 100 nm (Examples 5-21 to 5-28).

By using the resist pattern thus obtained by the negative development as a mask, the silicon-containing resist underlayer film was dry-etched under the above condition (1) and then dry-etched under the above condition (2) to transfer the pattern onto the spin-on carbon film. Pattern profile of cross section of the obtained pattern was measured with an electron microscope (S-9380, manufactured by Hitachi, Ltd.) and pattern roughness was measured with an electron microscope (CG 4000, manufactured by Hitachi High-technologies Corp.); and they were compared as summarized in Table 16.

TABLE 16

| Examples | Silicon-containing resist underlayer film | ArF resist | Pattern profile of cross section of spin-on carbon film after dry etching | Pattern roughness |
|---|---|---|---|---|
| Example 5-1 | Film11 | PR-3 | vertical profile | 1.7 nm |
| Example 5-2 | Film12 | PR-3 | vertical profile | 1.8 nm |
| Example 5-3 | Film13 | PR-3 | vertical profile | 1.8 nm |
| Example 5-4 | Film14 | PR-3 | vertical profile | 2.2 nm |
| Example 5-5 | Film15 | PR-3 | vertical profile | 1.7 nm |
| Example 5-6 | Film16 | PR-3 | vertical profile | 1.7 nm |
| Example 5-7 | Film17 | PR-3 | vertical profile | 1.5 nm |
| Example 5-8 | Film18 | PR-3 | vertical profile | 2.1 nm |
| Example 5-9 | Film19 | PR-3 | vertical profile | 1.5 nm |
| Example 5-10 | Film20 | PR-3 | vertical profile | 1.7 nm |
| Example 5-11 | Film21 | PR-4 | vertical profile | 1.7 nm |
| Example 5-12 | Film22 | PR-4 | vertical profile | 2.1 nm |
| Example 5-13 | Film23 | PR-4 | vertical profile | 1.7 nm |
| Example 5-14 | Film24 | PR-4 | vertical profile | 1.9 nm |
| Example 5-15 | Film25 | PR-4 | vertical profile | 1.9 nm |
| Example 5-16 | Film26 | PR-4 | vertical profile | 2.2 nm |
| Example 5-17 | Film27 | PR-4 | vertical profile | 1.6 nm |
| Example 5-18 | Film28 | PR-4 | vertical profile | 1.9 nm |
| Example 5-19 | Film29 | PR-4 | vertical profile | 1.6 nm |
| Example 5-20 | Film30 | PR-4 | vertical profile | 2.0 nm |
| Example 5-21 | Film31 | PR-5 | vertical profile | 2.0 nm |
| Example 5-22 | Film32 | PR-5 | vertical profile | 2.1 nm |
| Example 5-23 | Film33 | PR-5 | vertical profile | 2.0 nm |
| Example 5-24 | Film34 | PR-5 | vertical profile | 2.0 nm |
| Example 5-25 | Film35 | PR-5 | vertical profile | 1.8 nm |
| Example 5-26 | Film36 | PR-5 | vertical profile | 1.6 nm |
| Example 5-27 | Film37 | PR-5 | vertical profile | 2.0 nm |
| Example 5-28 | Film38 | PR-5 | vertical profile | 2.0 nm |
| Example 5-29 | Film39 | PR-3 | vertical profile | 2.2 nm |
| Example 5-30 | Film40 | PR-3 | vertical profile | 2.1 nm |
| Comparative Example 5-1 | Film43 | PR-3 | vertical profile | 4.5 nm |

In the present invention, as can be seen in Table 16, it was found that not only resist profile after development, but also pattern profile of cross section and pattern roughness after processing of the spin-on carbon film were excellent. On the other hand, in the silicon-containing film formed of only a silicon compound as the comparative example (Comparative Example 5-1), etching resistance of the component locally present near surface is comparatively high; and thus, during the time of dry etching of the resist underlayer film by using the upperlayer resist pattern as a mask, the upperlayer resist is damaged, which is observed finally as pattern roughness after processing of the spin-on carbon film.

As explained above, the present invention can provide (i) the composition for forming a silicon-containing resist underlayer film that is applicable not only to a resist pattern formed of a hydrophilic organic compound obtained by a negative development but also a resist pattern formed of a hydrophobic compound obtained by a conventional positive development, and (ii) the patterning process using this composition.

The present invention is not limited to the above embodiments. The above embodiments are merely illustrative, and whatever having the substantially same configurations as the technical concept recited in the appended claims and exhibiting the same functions and effects are embraced within the technical scope of the present invention.

What is claimed is:

1. A composition for forming a silicon-containing resist underlayer film comprising:

(A) a silicon-containing compound obtained by a hydrolysis-condensation reaction of a mixture containing, at least, one or more hydrolysable silicon compound shown by the following general formula (1) and one or more hydrolysable compound shown by the following general formula (2), $$R^1_{m1}R^2_{m2}R^3_{m3}Si(OR)_{(4-m1-m2-m3)} \quad (1)$$

wherein, R represents a hydrocarbon group having 1 to 6 carbon atoms; at least one of $R^1$, $R^2$, and $R^3$ is an organic group containing a hydroxyl group or a carboxyl group, the groups being substituted with an acid-labile group, while the other is a hydrogen atom or a monovalent organic group having 1 to 30 carbon atoms; and m1, m2, and m3 represent 0 or 1 and satisfy $1 \leq m1+m2+m3 \leq 3$;

$$U(OR^4)_{m4}(OR^5)_{m5} \quad (2)$$

wherein, $R^4$ and $R^5$ represent an organic group having 1 to 30 carbon atoms, and m4+m5 is the same number as the number determined by valency of U; m4 and m5 represent an integer of 0 or more; and the U is an element belonging to groups of III, IV, or V in a periodic table except for carbon and silicon; and (B) a silicon-containing compound obtained by a hydrolysis-condensation reaction of a mixture containing, at least, one or more hydrolysable silicon compound shown by the following general formula (3) and one or more hydrolysable silicon compound shown by the following general formula (4), $$R^6_{m6}R^7_{m7}R^8_{m8}Si(OR^9)_{(4-m6-m7-m8)} \quad (3)$$

wherein, $R^9$ represents an alkyl group having 1 to 6 carbon atoms, and each $R^6$, $R^7$, and $R^8$ represents a hydrogen atom or a monovalent organic group having 1 to 30 carbon atoms; and m6, m7, and m8 represent 0 or 1 and satisfy $1 \leq m6+m7+m8 \leq 3$;

$$Si(OR^{10})_4 \quad (4)$$

wherein, $R^{10}$ represents an alkyl group having 1 to 6 carbonatoms, and of the constituting units derived from the general formula (3) and the general formula (4) in the component (B), a mole ratio of the constituting unit derived from the general formula (4) is 50% or more by mole, and the composition is effective to provide a silicon-containing resist underlayer film having a pure-water contact angle of from 40 degrees or more to lower than 70 degrees after exposure.

2. The composition for forming a silicon-containing resist underlayer film according to claim 1, wherein mass ratio of the component (A) to the component (B) satisfies (B)/(A)≥1.

3. The composition for forming a silicon-containing resist underlayer film according to claim 2, wherein the U of the general formula (2) is any of boron, aluminum, gallium, yttrium, germanium, titanium, zirconium, hafnium, bismuth, tin, phosphorous, vanadium, arsenic, antimony, niobium, and tantalum.

4. A patterning process, wherein an organic underlayer film is formed on a body to be processed by using an application-type composition for the organic underlayer film, on this organic underlayer film is formed a silicon-containing resist underlayer film by using the composition for forming the silicon-containing resist underlayer film according to claim 3, on this silicon-containing resist underlayer film is formed a photoresist film by using a chemically amplified resist composition, the photoresist film is exposed to a high energy beam after heat treatment, a positive pattern is formed by dissolving an exposed area of the photoresist film by using an alkaline developer, pattern transfer is made onto the silicon-containing resist underlayer film by dry-etching by using the photoresist film having the positive pattern as a mask, pattern transfer is made onto the organic underlayer film by dry-etching by using the silicon-containing resist underlayer film having the transferred pattern as a mask, and then pattern transfer is made onto the body to be processed by dry-etching by using the organic underlayer film having the transferred pattern as a mask.

5. A patterning process, wherein an organic hard mask mainly comprising carbon is formed on a body to be processed by a CVD method, on this organic hard mask is formed a silicon-containing resist underlayer film by using the composition for forming the silicon-containing resist underlayer film according to claim 3, on this silicon-containing resist underlayer film is formed a photoresist film by using a chemically amplified resist composition, the photoresist film is exposed to a high energy beam after heat treatment, a positive pattern is formed by dissolving an exposed area of the photoresist film by using an alkaline developer, pattern transfer is made onto the silicon-containing resist underlayer film by dry-etching by using the photoresist film having the positive pattern as a mask, pattern transfer is made onto the organic hard mask by dry-etching by using the silicon-containing resist underlayer film having the transferred pattern as a mask, and then pattern transfer is made onto the body to be processed by dry-etching by using the organic hard mask having the transferred pattern as a mask.

6. A patterning process, wherein an organic underlayer film is formed on a body to be processed by using an application-type composition for the organic underlayer film, on this organic underlayer film is formed a silicon-containing resist underlayer film by using the composition for forming the silicon-containing resist underlayer film according to claim 3, on this silicon-containing resist underlayer film is formed a photoresist film by using a chemically amplified resist composition, the photoresist film is exposed to a high energy beam after heat treatment, a negative pattern is formed by dissolving an unexposed area of the photoresist film by using an organic solvent developer, pattern transfer is made onto the silicon-containing resist underlayer film by dry-etching by using the photoresist film having the negative pattern as a mask, pattern transfer is made onto the organic underlayer film by dry-etching by using the silicon-containing resist underlayer film having the transferred pattern as a mask, and then pattern transfer is made onto the body to be processed by dry-etching by using the organic underlayer film having the transferred pattern as a mask.

7. A patterning process, wherein an organic hard mask mainly comprising carbon is formed on a body to be processed by a CVD method, on this organic hard mask is formed a silicon-containing resist underlayer film by using the composition for forming the silicon-containing resist underlayer film according to claim 3, on this silicon-containing resist underlayer film is formed a photoresist film by using a chemically amplified resist composition, the photoresist film is exposed to a high energy beam after heat treatment, a negative pattern is formed by dissolving an unexposed area of the photoresist film by using an organic solvent developer, pattern transfer is made onto the silicon-containing resist underlayer film by dry-etching by using the photoresist film having the negative pattern as a mask, pattern transfer is made onto the organic hard mask by dry-etching by using the silicon-containing resist underlayer film having the transferred pattern as a mask, and then pattern transfer is made onto the body to be processed by dry-etching by using the organic hard mask having the transferred pattern as a mask.

8. The composition for forming a silicon-containing resist underlayer film according to claim 1, wherein the U of the general formula (2) is any of boron, aluminum, gallium, yttrium, germanium, titanium, zirconium, hafnium, bismuth, tin, phosphorous, vanadium, arsenic, antimony, niobium, and tantalum.

9. A patterning process, wherein an organic underlayer film is formed on a body to be processed by using an application-type composition for the organic underlayer film, on this organic underlayer film is formed a silicon-containing resist underlayer film by using the composition for forming the silicon-containing resist underlayer film according to claim 1, on this silicon-containing resist underlayer film is formed a photoresist film by using a chemically amplified resist composition, the photoresist film is exposed to a high energy beam after heat treatment, a positive pattern is formed by dissolving an exposed area of the photoresist film by using an alkaline developer, pattern transfer is made onto the silicon-containing resist underlayer film by dry-etching by using the photoresist film having the positive pattern as a mask, pattern transfer is made onto the organic underlayer film by dry-etching by using the silicon-containing resist underlayer film having the transferred pattern as a mask, and then pattern transfer is made onto the body to be processed by dry-etching by using the organic underlayer film having the transferred pattern as a mask.

10. The patterning process according to claim 9, wherein, in photo-exposure of the photoresist film, change of the contact angle in a part of the silicon-containing resist underlayer film corresponding to an unexposed area of the exposed photoresist film is 10 degree or less as compared with before photo-exposure.

11. The patterning process according to claim 9, wherein the body to be processed is a substrate for a semiconductor device, or the substrate for a semiconductor device coated, as a layer to be processed, with any of a metal film, a metal carbide film, a metal oxide film, a metal nitride film, a metal oxycarbide film, and a metal oxynitride film.

12. The patterning process according to claim 11, wherein the metal that constitutes the body to be processed is silicon, titanium, tungsten, hafnium, zirconium, chromium, germanium, copper, aluminum, iron, or an alloy of these metals.

13. A patterning process, wherein an organic hard mask mainly comprising carbon is formed on a body to be processed by a CVD method, on this organic hard mask is formed a silicon-containing resist underlayer film by using the composition for forming the silicon-containing resist underlayer film according to claim 1, on this silicon-containing resist underlayer film is formed a photoresist film by using a chemically amplified resist composition, the photoresist film is exposed to a high energy beam after heat treatment, a positive pattern is formed by dissolving an exposed area of the photoresist film by using an alkaline developer, pattern transfer is made onto the silicon-containing resist underlayer film by dry-etching by using the photoresist film having the positive pattern as a mask, pattern transfer is made onto the organic hard mask by dry-etching by using the silicon-containing resist underlayer film having the transferred pattern as a mask, and then pattern transfer is made onto the body to be processed by dry-etching by using the organic hard mask having the transferred pattern as a mask.

14. The patterning process according to claim 13, wherein, in photo-exposure of the photoresist film, change of the contact angle in a part of the silicon-containing resist underlayer film corresponding to an unexposed area of the exposed photoresist film is 10 degree or less as compared with before photo-exposure.

15. The patterning process according to claim 13, wherein the body to be processed is a substrate for a semiconductor device, or the substrate for a semiconductor device coated, as a layer to be processed, with any of a metal film, a metal carbide film, a metal oxide film, a metal nitride film, a metal oxycarbide film, and a metal oxynitride film.

16. The patterning process according to claim 15, wherein the metal that constitutes the body to be processed is silicon, titanium, tungsten, hafnium, zirconium, chromium, germanium, copper, aluminum, iron, or an alloy of these metals.

17. A patterning process, wherein an organic underlayer film is formed on a body to be processed by using an application-type composition for the organic underlayer film, on this organic underlayer film is formed a silicon-containing resist underlayer film by using the composition for forming the silicon-containing resist underlayer film according to claim 1, on this silicon-containing resist underlayer film is formed a photoresist film by using a chemically amplified resist composition, the photoresist film is exposed to a high energy beam after heat treatment, a negative pattern is formed by dissolving an unexposed area of the photoresist film by using an organic solvent developer, pattern transfer is made onto the silicon-containing resist underlayer film by dry-etching by using the photoresist film having the negative pattern as a mask, pattern transfer is made onto the organic underlayer film by dry-etching by using the silicon-containing resist underlayer film having the transferred pattern as a mask, and then pattern transfer is made onto the body to be processed by dry-etching by using the organic underlayer film having the transferred pattern as a mask.

18. The patterning process according to claim 17, wherein, in photo-exposure of the photoresist film, the contact angle of a part of the silicon-containing resist underlayer film corresponding to an exposed area of the exposed photoresist film is decreased by 10 degrees or more after photo-exposure as compared with before photo-exposure.

19. The patterning process according to claim 17, wherein the body to be processed is a substrate for a semiconductor device, or the substrate for a semiconductor device coated, as a layer to be processed, with any of a metal film, a metal carbide film, a metal oxide film, a metal nitride film, a metal oxycarbide film, and a metal oxynitride film.

20. The patterning process according to claim 19, wherein the metal that constitutes the body to be processed is silicon, titanium, tungsten, hafnium, zirconium, chromium, germanium, copper, aluminum, iron, or an alloy of these metals.

21. A patterning process, wherein an organic hard mask mainly comprising carbon is formed on a body to be processed by a CVD method, on this organic hard mask is formed a silicon-containing resist underlayer film by using the composition for forming the silicon-containing resist underlayer film according to claim 1, on this silicon-containing resist underlayer film is formed a photoresist film by using a chemically amplified resist composition, the photoresist film is exposed to a high energy beam after heat treatment, a negative pattern is formed by dissolving an unexposed area of the photoresist film by using an organic solvent developer, pattern transfer is made onto the silicon-containing resist underlayer film by dry-etching by using the photoresist film having the negative pattern as a mask, pattern transfer is made onto the organic hard mask by dry-etching by using the silicon-containing resist underlayer film having the transferred pattern as a mask, and then pattern transfer is made onto the body to be processed by dry-etching by using the organic hard mask having the transferred pattern as a mask.

22. The patterning process according to claim 21, wherein, in photo-exposure of the photoresist film, the contact angle of a part of the silicon-containing resist underlayer film corresponding to an exposed area of the exposed photoresist film is decreased by 10 degrees or more after photo-exposure as compared with before photo-exposure.

23. The patterning process according to claim 21, wherein the body to be processed is a substrate for a semiconductor device, or the substrate for a semiconductor device coated, as a layer to be processed, with any of a metal film, a metal carbide film, a metal oxide film, a metal nitride film, a metal oxycarbide film, and a metal oxynitride film.

24. The patterning process according to claim 23, wherein the metal that constitutes the body to be processed is silicon, titanium, tungsten, hafnium, zirconium, chromium, germanium, copper, aluminum, iron, or an alloy of these metals.

* * * * *